United States Patent
Wada et al.

(10) Patent No.: US 9,786,450 B2
(45) Date of Patent: Oct. 10, 2017

(54) MEMBRANE SWITCH AND OBJECT EMPLOYING SAME

(71) Applicant: AJINOMOTO CO., INC., Tokyo (JP)

(72) Inventors: Yoshinori Wada, Kawasaki (JP); Hiroyasu Koto, Kawasaki (JP); Yuichi Watanabe, Tsukuba (JP); Sei Uemura, Tsukuba (JP); Manabu Kitazawa, Kawasaki (JP); Satoru Ohashi, Kawasaki (JP); Toshihide Kamata, Tsukuba (JP)

(73) Assignee: AJINOMOTO CO., INC., Tokyo (JP)

(*) Notice: Subject to any disclaimer, the term of this patent is extended or adjusted under 35 U.S.C. 154(b) by 167 days.

(21) Appl. No.: 14/706,156

(22) Filed: May 7, 2015

(65) Prior Publication Data

US 2015/0311012 A1  Oct. 29, 2015

Related U.S. Application Data

(63) Continuation of application No. PCT/JP2013/080181, filed on Nov. 8, 2013.

(30) Foreign Application Priority Data

Nov. 8, 2012  (JP) .................................. 2012-246364

(51) Int. Cl.
  *H01L 41/04*  (2006.01)
  *H01H 13/14*  (2006.01)
  (Continued)

(52) U.S. Cl.
  CPC ......... *H01H 13/14* (2013.01); *H01L 41/1132* (2013.01); *H01L 41/183* (2013.01);
  (Continued)

(58) Field of Classification Search
  CPC ...................................................... H01L 41/193
  (Continued)

(56) References Cited

U.S. PATENT DOCUMENTS

| 4,234,813 A | 11/1980 | Iguchi et al. |
| 4,516,112 A * | 5/1985 | Chen ....................... G06F 3/041 |
| | | 310/311 |

(Continued)

FOREIGN PATENT DOCUMENTS

| CN | 2379973 Y | 5/2000 |
| CN | 1595553 A | 3/2005 |

(Continued)

OTHER PUBLICATIONS

Extended European Search Report in Patent Application No. 13853772.5.

(Continued)

*Primary Examiner* — J. San Martin
(74) *Attorney, Agent, or Firm* — Oblon, McClelland, Maier & Neustadt, L.L.P.

(57) ABSTRACT

A membrane switch in which a first conductive part is formed on a first substrate, a second conductive part is formed on a second substrate, and the substrates are layered via a spacer such that the conductive parts face each other with a space therebetween, and an organic material showing piezoelectricity is filled, or disposed in the space such that an air gap is present, are useful for obtaining an output signal corresponding to an applied pressure.

30 Claims, 10 Drawing Sheets

(51) Int. Cl.
  H03K 17/96  (2006.01)
  H01L 41/113 (2006.01)
  H01L 41/18  (2006.01)
  H01L 41/193 (2006.01)
(52) U.S. Cl.
  CPC ....... *H01L 41/193* (2013.01); *H03K 17/9643* (2013.01); *H01H 2209/024* (2013.01); *H01H 2209/074* (2013.01); *H01H 2221/002* (2013.01)
(58) Field of Classification Search
  USPC .................................................. 310/328, 800
  See application file for complete search history.

(56) References Cited

U.S. PATENT DOCUMENTS

| | | | | |
|---|---|---|---|---|
| 4,755,707 | A * | 7/1988 | Nakaya | H01L 37/02 250/338.3 |
| 4,901,074 | A * | 2/1990 | Sinn | F24C 7/082 200/5 A |
| 5,374,449 | A | 12/1994 | Bühlmann et al. | |
| 5,467,080 | A | 11/1995 | Stoll et al. | |
| 6,700,508 | B1 * | 3/2004 | Nomura | H01H 13/702 341/22 |
| 2003/0000821 | A1 | 1/2003 | Takahashi et al. | |
| 2004/0263483 | A1 | 12/2004 | Aufderheide | |
| 2009/0309616 | A1 | 12/2009 | Klinghult et al. | |
| 2010/0156845 | A1 | 6/2010 | Kim et al. | |
| 2010/0253552 | A1* | 10/2010 | Lanceros Mendez | G06F 3/023 341/22 |
| 2015/0241908 | A1* | 8/2015 | Ozyilmaz | H01L 41/193 345/174 |

FOREIGN PATENT DOCUMENTS

| | | |
|---|---|---|
| CN | 1723517 A | 1/2006 |
| CN | 201780912 U | 3/2011 |
| EP | 0 576 400 A1 | 12/1993 |
| EP | 0 933 873 A1 | 8/1999 |
| JP | 51-21180 | 2/1976 |
| JP | 61-131315 A | 6/1986 |
| JP | 64-76625 A | 3/1989 |
| JP | 9-35569 A | 2/1997 |
| JP | 2002-358852 A | 12/2002 |
| JP | 2003-63392 A | 3/2003 |
| WO | WO 2004-053909 A1 | 6/2004 |
| WO | WO 2009/011605 A2 | 1/2009 |
| WO | WO 2011/078164 A1 | 6/2011 |

OTHER PUBLICATIONS

Email from Mewburn Ellis LLP, sent Dec. 6, 2016 in European Patent Application No. 13853772.5.
Dawnielle Farrar et al., "Permanent Polarity and Piezoelectricity of Electrospun [alpha]-Helical Poly([alpha]-Amino Acid) Fibers", Advanced Materials, vol. 23, No. 34, Jul. 28, 2011, XP055006196, pp. 3954-3958.
Kailiang Ren et al., "Piezoelectric property of hot pressed electrospun poly([gamma]-benzyl-[alpha], L-glutamate) fibers" Applied Physics A; Materials Science & Processing, vol. 107, No. 3, Feb. 29, 2012, XP035057127, pp. 639-646.
European Communication Pursuant to Rule 164(1) EPC with partial supplementary Search Report issued Aug. 11, 2016 in Patent Application No. 13853772.5.
Combined Chinese Office Action and Search Report issued Jun. 29, 2016 in Patent Application No. 201380058477.9 (with English language translation).

* cited by examiner

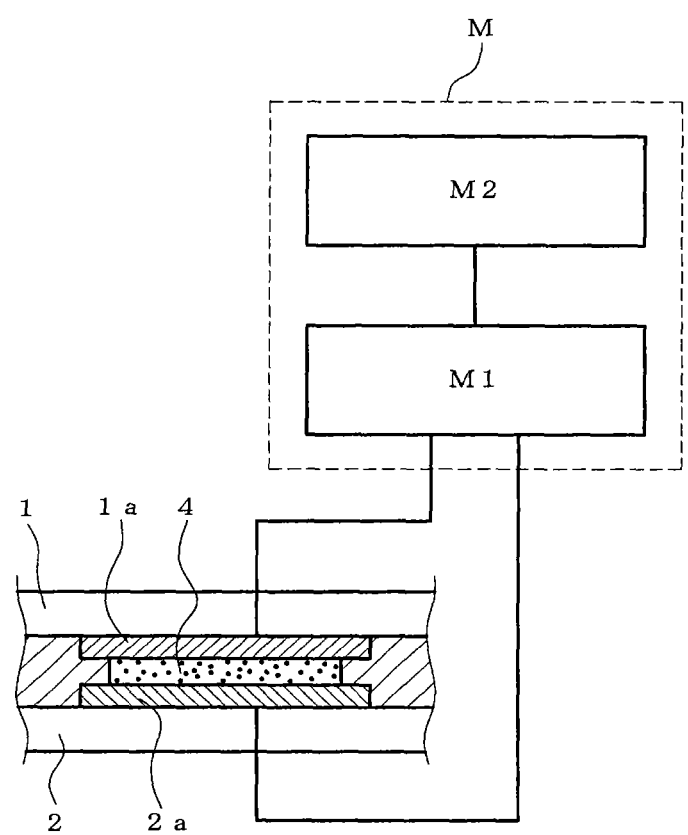

MEMBRANE SWITCH AND OBJECT EMPLOYING SAME

CROSS REFERENCES TO RELATED APPLICATIONS

This application is a continuation of International Patent Application No. PCT/JP2013/080181, filed on Nov. 8, 2013, and claims priority to Japanese Patent Application No. 2012-246364, filed on Nov. 8, 2012, both of which are incorporated herein by reference in their entireties.

BACKGROUND OF THE INVENTION

Field of the Invention

The present invention relates to membrane switches which have a sheet-like shape. The present invention also relates to various uses of such a membrane switch.

Discussion of the Background

A membrane switch is a sheet-like switch wherein a conductive part (part made of an electrically conductive material to be a contact of the switch) is formed on each of two sheets of substrates, and the substrates are laminated with a spacer lying between them such that the conductive parts face each other and a space is secured between the conductive parts (see JP-A-01-076625, which is incorporated herein by reference in its entirety).

FIGS. 10A and 10B are cross-sectional views schematically showing an enlarged structure of one switch part of a conventional membrane switch. As shown in these Figures, conductive parts 110, 210 to be contact points are formed on each of two sheets of substrates 100, 200, and a spacer 300 is interposed between them such that the conductive parts 110, 210 face each other with a predetermined space s therebetween.

In the embodiment of FIG. 10A, since the area of conductive parts 110, 210 is larger than the opening area of a through-hole 310 formed in the spacer 300, the outer-peripheral edges of the conductive parts 110, 210 protrude from the opening of the through-hole in the spacer. In FIG. 10A, although the conductive parts are drawn to appear thick for explanation, they are in fact thin and the spacer is not highly compressed by the conductive parts during assembly. On the other hand, in the embodiment of FIG. 10B, since the area of conductive parts 110, 210 is smaller than the opening area of a through-hole 310 formed in the spacer 300, the conductive parts 110, 210 face each other while being settled in the opening of the through-hole in the spacer.

In a membrane switch, at least one of the opposing conductive parts 110, 210 is movable (capable of being displaced toward the other conductive part, making contact therewith and returning) due to the elasticity of the substrate. Therefore, as shown with thick arrows in FIGS. 10A and 10B, when a substrate on the movable conductive part side is pressed from the outside, two conductive parts 110, 210 come into contact to be electrically conducted, and when pressing is released, contacting is broken and on and off signals can be obtained.

Since such a membrane switch has a simple structure, it can be manufactured at a low cost and the reliability of an on-off operation is high, it is frequently utilized in a wide range of fields for a keyboard of a mobile phone or a personal computer, switches of household electrical appliance, switches of remote-controller and the like.

The present inventors detailedly studied the structure and function of the conventional membrane switch as mentioned above, and took note of the fact that conventional membrane switch is simply capable of receiving only on (close) and off (open) signals. They took up a problem that the use thereof should be expanded more than not only on and off, by imparting a membrane switch with a new structure capable of outputting a signal corresponding to the amount of the pressure applied from the outside.

SUMMARY OF THE INVENTION

Accordingly, it is one object of the present invention to provide novel membrane switches having a new structure capable of obtaining a signal corresponding to the amount of pressure applied from the outside.

It is another object of the present invention to provide novel uses of such a membrane switch.

These and other objects, which will become apparent during the following detailed description, have been achieved by the inventors' discovery that, in the structure of a conventional membrane switch, a signal corresponding to the pressure applied from the outside is obtained by disposing (filling, or disposing while leaving an air gap) an organic material showing piezoelectricity in a predetermined space between contact points facing each other with said space therebetween.

The present invention therefore provides the following:

(1) A membrane switch having a structure in which a first conductive part is formed on a first substrate, a second conductive part is formed on a second substrate, and the first substrate and the second substrate are layered via a spacer such that said conductive parts face each other with a space therebetween, wherein an organic material showing piezoelectricity is filled in the space, or an organic material showing piezoelectricity is disposed in the space such that an air gap is present between the organic material and one of the conductive parts.

(2) The membrane switch of the above-mentioned (1), wherein a plurality of the first conductive parts are formed in a given arrangement pattern on the first substrate, a plurality of the second conductive parts are formed on the second substrate in an arrangement pattern corresponding to said arrangement pattern, the first substrate and the second substrate are layered via a spacer such that a structure wherein the plurality of the conductive parts face each other with a space therebetween and plural pairs of conductive parts are arranged, and an organic material showing piezoelectricity is filled or disposed to leave an air gap in the space between the conductive parts of each pair of the conductive parts.

(3) The membrane switch of the above-mentioned (1) or (2), wherein the outer circumference of the space between the conductive parts is surrounded by the spacer.

(4) The membrane switch according to any one of the above-mentioned (1)-(3), wherein the aforementioned spacer is formed by a punching process of a film having a thickness of the aforementioned spacer and made of a material of the spacer.

(5) The membrane switch according to any one of the above-mentioned (1)-(3), wherein the aforementioned spacer is formed by coating one or both of a principal surface of the first substrate and a principal surface of the second substrate with an insulating material.

(6) The membrane switch according to the above-mentioned (5), wherein the material of one or both of the first substrate and the second substrate, and the material of the spacer are the same insulating material.

(7) The membrane switch according to any one of the above-mentioned (1)-(6), wherein the organic material showing piezoelectricity is at least one kind selected from
(a) an organic piezoelectric substance having piezoelectricity by itself,
(b) a composite material comprising a base material composed of an organic piezoelectric substance having piezoelectricity by itself, and a filler made of other material having piezoelectricity by itself and dispersed in the base material, which composite material as a whole being an organic material showing piezoelectricity different from the piezoelectricity of the base material, and
(c) a composite material comprising a base material composed of an organic material without having piezoelectricity and a filler made of a material having piezoelectricity by itself and dispersed in the base material, which composite material as a whole being an organic material showing piezoelectricity.
(8) The membrane switch according to any one of the above-mentioned (1)-(6), wherein the organic material showing piezoelectricity is poly(amino acid).
(9) The membrane switch according to (8), wherein the poly(amino acid) is poly(α-amino acid) containing one or more kinds of units selected from glycine, alanine, valine, leucine, isoleucine, arginine, asparagine, aspartic acid, cystine, cysteine, glutamine, glutamic acid, histidine, lysine, ornithine, serine, threonine, tryptophan, methionine, phenylalanine, tyrosine and a derivative thereof.
(10) The membrane switch according to (8), wherein the poly(amino acid) is poly(α-amino acid) containing one or more kinds of units selected from
a unit represented by the following formula (I),
a unit represented by the following formula (II),
a unit represented by the following formula (III),
a unit represented by the following formula (IV), and
a unit represented by the following formula (V):
the formula (I):

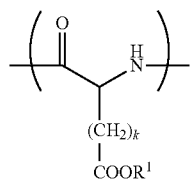

wherein k is an integer of 1 or 2, and $R^1$ is a $C_1$-$C_8$ substituted or unsubstituted alkyl group, or a benzyl group optionally substituted by a halogen atom, an alkoxy group or a nitro group
the formula (II):

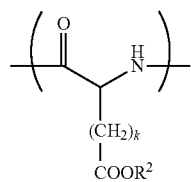

wherein k is an integer of 1 or 2, and $R^2$ is a $C_3$-$C_{16}$ unsubstituted alkyl group or a $C_1$-$C_6$ alkyl group wherein a part of or all hydrogen atoms are substituted by a halogen atom, a $C_3$-$C_{12}$ alicyclic hydrocarbon group, a $C_1$-$C_6$ alkoxy group, a cyano group, a phenyl group optionally having substituent(s), a phenylalkoxy group optionally having substituent(s) or a phenylalkylcarbamate group optionally having substituent(s), provided that $R^2$ is not the same group as $R^1$ in the formula (I),
the formula (III):

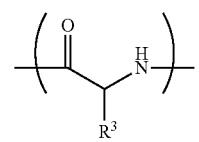

wherein $R^3$ is a methyl group, a benzyl group or a —$(CH_2)_4$—NHX group, provided that X is a halogen atom or a benzyloxycarbonyl group optionally substituted by a $C_1$-$C_6$ alkoxy group, a $C_1$-$C_6$ alkylcarbonyl group optionally substituted by a halogen atom, an allyloxycarbonyl group, a fluorenylalkoxycarbonyl group, a $C_1$-$C_6$ alkyl group or a benzenesulfonyl group optionally substituted by a nitro group, or a $C_1$-$C_6$ alkyloxycarbonyl group,
the formula (IV):

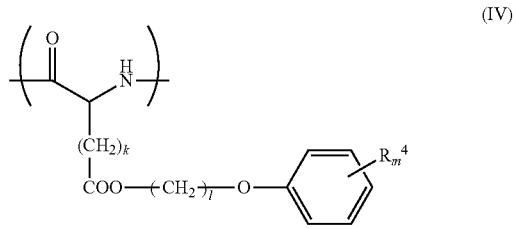

wherein k is an integer of 1 or 2, $R^4$ is a $C_1$-$C_{12}$ alkoxy group, a $C_1$-$C_{12}$ alkyl group wherein a part of or all hydrogen atoms are substituted by a halogen atom, or a $C_1$-$C_{12}$ alkylcarbonyl group, $R^4$ in the number of m may be the same or different, l is an integer of 6-12, and m is an integer of 1-3,
the formula (V):

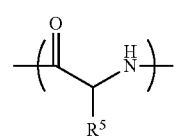

wherein $R^5$ is a hydrogen atom, a methyl group, —CH(OH)CH$_3$, a $C_3$-$C_4$ branched chain alkyl group, or —$(CH_2)_n$—Z, provided that n is an integer of 1-4, and Z is a hydroxy group, a mercapto group, a carboxy group, a methylsulfanyl group, an amino group, a substituted aryl group, an aminocarbonyl group, —NH—C(NH$_2$)=NH,

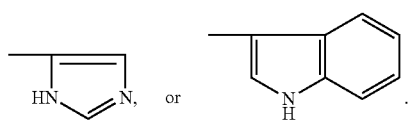

(11) The membrane switch according to the above-mentioned (10), wherein the poly(α-amino acid) is poly(α-amino acid) containing (A) one or more kinds of units represented by the formula (I), (B) one or more kinds of units selected from a unit represented by the formula (II), a unit represented by the formula (III) and a unit represented by the formula (IV).

(12) The membrane switch according to the above-mentioned (10) or (11), wherein $R^2$ is a $C_6$-$C_{16}$ unsubstituted alkyl group, or a $C_1$-$C_6$ substituted alkyl group wherein a part of or all hydrogen atoms are substituted by a fluorine atom or a norbornyl group.

(13) The membrane switch according to the above-mentioned (10) or (11), wherein $R^2$ is an n-hexyl group, an n-dodecyl group, a 2-norbornylmethyl group or a 2,2,2-trifluoroethyl group.

(14) The membrane switch according to any one of the above-mentioned (10)-(13), wherein $R^3$ is a methyl group or a —$(CH_2)_4$—NHX group (wherein X is a benzyloxycarbonyl group).

(15) The membrane switch of any one of the above-mentioned (10)-(14), wherein $R^4$ is a $C_1$-$C_6$ an alkoxy group, a $C_1$-$C_{12}$ alkyl group wherein a part of or all hydrogen atoms are substituted by a fluorine atom, or a $C_3$-$C_9$ alkylcarbonyl group.

(16) The membrane switch of any one of the above-mentioned (10)-(14), wherein $R^4$ is a methoxy group, a butoxy group, a hexyloxy group, a trifluoromethyl group, or an n-hexylcarbonyl group.

(17) The membrane switch of any one of the above-mentioned (10)-(16), wherein $R^5$ is a hydrogen atom, a 4-aminobutyl group, a 4-hydroxybenzyl group, an aminocarbonylethyl group, or —$(CH_2)_3$—NH—$C(NH_2)$=NH.

(18) The membrane switch of the above-mentioned (10), wherein the poly(amino acid) is poly(α-amino acid) containing one or more kinds of units selected from glutamic acid, aspartic acid, lysine and a derivative thereof.

(19) The membrane switch of the above-mentioned (10), wherein the poly(amino acid) is poly(α-amino acid) containing one or more kinds of units selected from glutamic acid methyl ester, glutamic acid benzyl ester, aspartic acid benzyl ester, and Nε-carbobenzoxy-L-lysine.

(20) The membrane switch of the above-mentioned (10), wherein the poly(α-amino acid) is one or more kinds selected from γ-methyl-L-glutamic acid/γ-hexyl-L-glutamic acid copolymer, γ-methyl-L-glutamic acid/γ-dodecyl-L-glutamic acid copolymer, γ-benzyl-L-glutamic acid/γ-dodecyl-L-glutamic acid copolymer, γ-methyl-L-glutamic acid/γ-2,2,2-trifluoroethyl-L-glutamic acid copolymer, γ-methyl-L-glutamic acid/γ-2-norbornylmethyl-L-glutamic acid copolymer, γ-benzyl-L-glutamic acid/γ-2-norbornylmethyl-L-glutamic acid copolymer, γ-methyl-L-glutamic acid/γ-(6-(p-methoxyphenoxy)-1-hexyl)-L-glutamic acid copolymer, γ-methyl-L-glutamic acid/γ-(6-(p-hexylcarbonylphenoxy)-1-hexyl)-L-glutamic acid copolymer, γ-methyl-L-glutamic acid/γ-(10-(p-methoxyphenoxy)-1-decyl)-L-glutamic acid copolymer, γ-methyl-L-glutamic acid/γ-(6-(p-butoxy phenoxy)-1-hexyl)-L-glutamic acid copolymer, γ-methyl-L-glutamic acid/γ-(6-(p-hexyloxyphenoxy)-1-hexyl)-L-glutamic acid copolymer, γ-methyl-L-glutamic acid/γ-(6-(3,5-bis(trifluoromethyl)phenoxy)-1-hexyl)-L-glutamic acid copolymer, γ-methyl-L-glutamic acid/Nε-benzyloxycarbonyl-L-lysine copolymer, γ-benzyl-L-glutamic acid/Nε-benzyloxycarbonyl-L-lysine copolymer, γ-methyl-L-glutamic acid/L-phenylalanine copolymer, γ-benzyl-L-glutamic acid/L-phenylalanine copolymer, and γ-benzyl-L-glutamic acid/L-alanine copolymer.

(21) The membrane switch of any one of the above-mentioned (11)-(20), wherein the poly(α-amino acid) is a random copolymer.

(22) The membrane switch of any one of the above-mentioned (11)-(20), wherein the poly(α-amino acid) is a block copolymer.

(23) The membrane switch of any one of the above-mentioned (10)-(22), comprising that the weight average molecular weight (Mw) of the poly(α-amino acid) is 1,000-5,000,000.

(24) The membrane switch according to any one of the above-mentioned (1)-(23), wherein the organic material filled or disposed to leave an air gap in the space between the conductive parts is polarization-processed by applying a voltage between the conductive parts.

(25) The membrane switch according to any one of the above-mentioned (1)-(24), wherein either one or both of the first substrate and the second substrate is/are flexible substrate(s) formed from a material having flexibility.

(26) The membrane switch according to any one of the above-mentioned (1)-(24), wherein the first substrate, the second substrate, and the spacer are formed from a material having flexibility, and the whole membrane switch has flexibility.

(27) The membrane switch according to any one of the above-mentioned (1)-(24), wherein an adhesive layer is interposed between either one or both of the first substrate and the spacer, and the second substrate and the spacer.

(28) The membrane switch according to any one of the above-mentioned (1)-(27), wherein an adhesive layer is interposed between the organic material filled or disposed to leave an air gap in the space between the conductive parts, and the conductive part.

(29) The membrane switch according to any one of the above-mentioned (1)-(28), wherein the first conductive part, the second conductive part, and a wiring circuit connected to the conductive parts are formed by printing on the surfaces of the first and the second substrates.

(30) An article comprising the membrane switch according to any one of the above-mentioned (1)-(29), which membrane switch is disposed along a surface layer of the article that receives a pressure, whereby the article has a function to generate a signal corresponding to the received pressure.

Effect of the Invention

In one embodiment of the membrane switch of the present invention, an organic material showing piezoelectricity (hereinafter to be also referred simply to as an organic material) is filled in a space, which is a simple air gap in conventional membrane switch, between contact points (conductive parts) (embodiment of FIGS. 1A, 1B, and 1C). In other embodiment of the membrane switch of the present invention, an organic material is disposed between both conductive parts such that an air gap is present between the organic material and the conductive part on either side (embodiment of FIGS. 5A, 5B, and 5C). By employing these structures, a pressure acts in the direction closing the both conductive parts (thickness direction of the first and the second substrates) even though it is a membrane switch and, when the organic material filled or disposed to leave an air gap between the conductive parts is compressed, piezoelectricity occurs in the organic material and polarization corresponding to the magnitude of the pressure is produced.

That is, when the organic material is deformed, an electric charge is generated on both ends of the organic material due to the piezoelectric effect. Therefore, the generated electric charge can be extracted as electric signals through the conductive parts. That is, by measuring changes in the electric properties between conductive parts, such as changes in a small electric current flown into the conductive parts (or flown out from conductive parts), changes in the voltage between conductive parts, changes in the electric capacity between conductive parts and the like, an off state when a pressure is not applied and voltage values, electric current values, other parameters and signals showing a state when pressure is applied can be respectively obtained in multisteps (or non-step) according to the pressure.

When the first and the second substrates have a larger area, plural conductive parts are disposed in a given arrangement pattern on both substrate surfaces, respective conductive parts on the both substrate surfaces are made to correspond between the substrates to form an array structure wherein plural pairs of conductive parts are arranged on a single flat plane, and an organic material showing piezoelectricity is filled or disposed to leave an air gap in a space in respective pairs of conductive parts, the pressure and load acting on each contact point can be detected separately, and distribution of the pressure and load in the surface can be known by a simple structure.

Furthermore, when a substrate having flexibility (flexible substrate) is used as the first and the second substrates, the membrane switch is a sheet-like product having flexibility as a whole, which can be disposed on a surface layer of various articles while following curves freely. As a result, it can be easily mounted on a structure that curves when a load is applied, such as a bed, a mat and the like, a curved surface of a seat and the like of a vehicle, such as automobile and the like, and the like, and can impart such articles with a function to generate signals according to an applied pressure.

As shown in FIGS. 5A, 5B, and 5C, when an air gap s1 is formed between a conductive part 1a on one side and an organic material 4, the organic material 4 is pressed after displacement of the conductive part 1a by the amount of the air gap s1.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein:

FIG. 2 is a cross-sectional view showing one embodiment of use method of the membrane switch of the present invention.

FIG. 3 is a perspective view showing the principal surface of each layer of one embodiment of the membrane switch of the present invention in an exploded view. The thickness of the substrate and conductive part is not shown. As for the spacer, the thickness is shown to achieve easy recognition that a through-hole (3a1, 3a2) is a hole. The conductive part and wiring circuit formed on the second substrate 2 are shown with a broken line in this Figure since they are present on the other side of the substrate. This Figure aims to show correspondence relation of respective layers for easy understanding, and does not limit assembly procedure such as lamination of separately-formed films and the like.

Figure 1A:
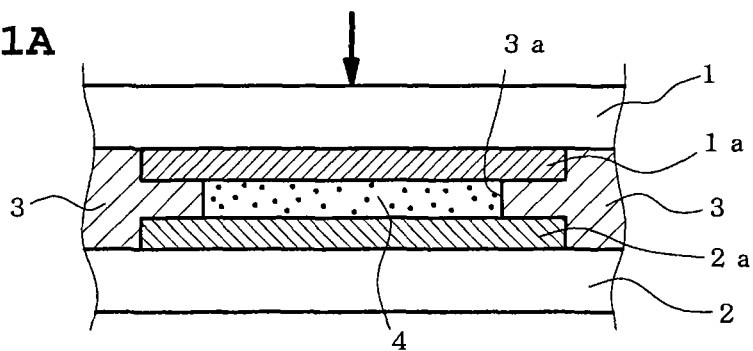
FIGS. 1A, 1B, and 1C are cross-sectional views schematically showing an example of the structure of the membrane switch of the present invention. In these Figures, the ratio of thicknesses of respective layers and the ratio with the size in the lateral direction are exaggerated for the explanation's sake. Hatching is added as appropriate only to the necessary parts to facilitate distinction of regions. The same applies to other Figures. A thick arrow in the drawing shows the load (pressing force) acting from the outside.

EXPLANATION OF SYMBOLS 1 first substrate
1a first conductive part
2 second substrate
2a second conductive part
3 spacer
3a through-hole
4 organic material showing piezoelectricity

DETAILED DESCRIPTION OF THE PREFERRED EMBODIMENTS

The present invention is explained below by way of preferable embodiments.

The membrane switch of the present invention has a structure wherein, as in the structure examples shown in FIGS. 1A, 1B, 1C, 5A, 5B, and 5C, a first conductive part 1a is formed on the principal surface of a first substrate 1, a second conductive part 2a is formed on the principal surface of a second substrate 2, and the first substrate 1 and the second substrate 2 are laminated via a spacer 3 such that these conductive parts (1a, 2a) face each other with a space.

Figure 1B:
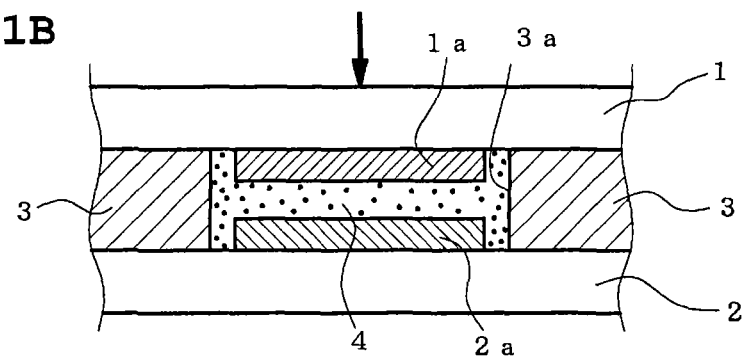
Figure 1C:
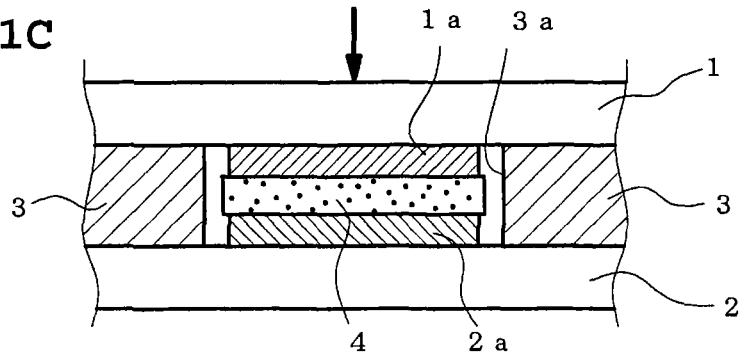
Figure 5A:
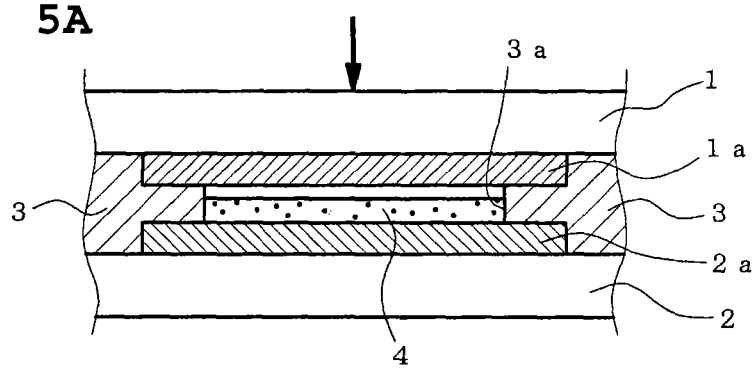
FIGS. 5A, 5B, and 5C are cross-sectional views schematically showing other embodiment example of the membrane switch of the present invention.
Figure 5B:
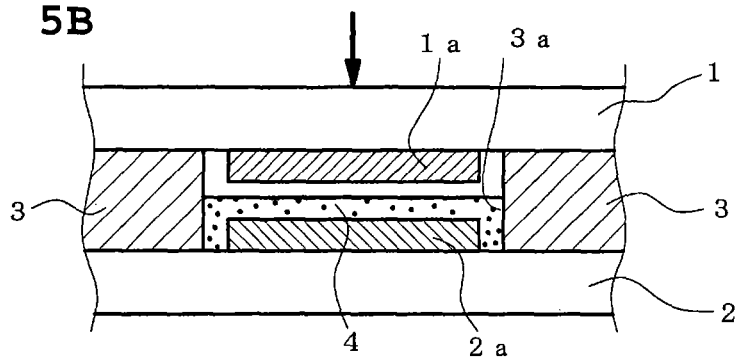
Figure 5C:
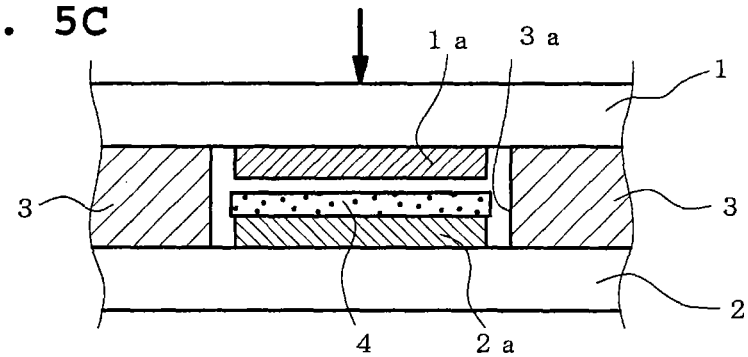

In the present invention, an organic material showing piezoelectricity 4 is filled, as in the structure examples shown in FIGS. 1A, 1B, and 1C, in a space between the conductive parts (1a, 2a) in the switch structure or, as in the structure example shown in FIGS. 5A, 5B, and 5C, the organic material showing piezoelectricity 4 is disposed to leave an air gap s1 between a conductive part on one side (upper side conductive part 2a in the Figure) and the organic material 4.

Having such unique structure, when used as exemplified in the block diagram shown in FIG. 2, voltage values, electric current values, other parameters and signals indicating the states with or without an acting pressure (or outside load attempting to compress the membrane switch in the thickness direction) are obtained by measuring the electric property between the conductive parts (1a, 2a) by a measuring part M1 of an external device M. A configuration for transmitting an output corresponding thereto to a control part M2 and the like of an external device and utilizing the output for various applications can be provided.

In the embodiments of FIGS. 1A and 5A, the areas of the conductive parts 1a and 2a are larger than the opening area of the through-hole 3a formed on the spacer 3 so that the first conductive part and the second conductive part can face each other. Therefore, the outer-peripheral edge of the conductive parts protrudes from the opening of the through-hole 3a.

As used herein, the "through-hole" formed in the spacer in the present invention refers to an empty space part penetrating the spacer in the thickness direction of the membrane switch for the purpose of having the first conductive part and the second conductive part facing each other. The through-hole may be an empty space part formed later in a sheet-like spacer by hole forming and the like, an empty space part present in a spacer from the beginning due to resin molding and the like, an empty space part left after first designing an empty space part for having the first conductive part and the second conductive part facing each other and later disposing a spacer material in a part other than the empty space part, or an empty space part formed by photolithography by exposing and developing a photosensitive material. The lateral side periphery of the empty space part in the through-hole is not necessarily surrounded completely by the material of the spacer. For example, the adjacent through-holes may be communicating with each other, or communicating with a space part formed in the spacer for other purposes (air release, light-weighting and the like), or communicating with an external space at the periphery side face of the spacer. Alternatively, for example, even when the parts where a spacer material is present are discrete, thus forming independent supporting columns, such space parts fall under the aforementioned through-hole as long as the remaining space parts are connected like a network. The through-hole may, depending on the shape, simultaneously be a space part such as a groove formed in the spacer for other object and the like.

Figure 10A:
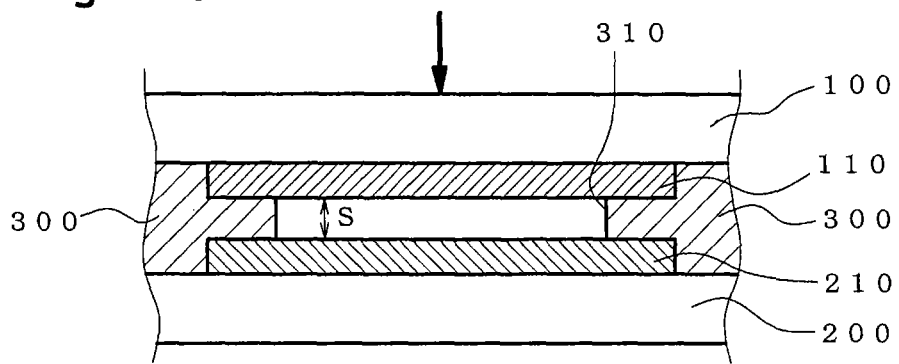
FIGS. 10A and 10B are cross-sectional views showing the structure of a conventional membrane switch.
Figure 10B:
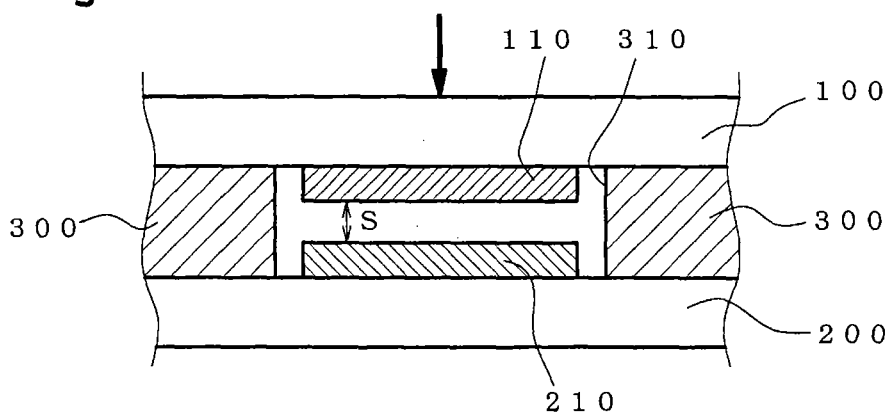

Similar to FIG. 10A, a thick conductive part is drawn in FIGS. 1A and 5A for the explanation. In fact, the conductive part is thin, and the spacer is not greatly compressed by the conductive part. In the embodiment of FIG. 1A, an organic material 4 is filled in the entire through-hole, and in the embodiment of FIG. 5A, an air gap s1 is present between the organic material 4 and the conductive part 1a.

In the embodiments of FIGS. 1B and 5B, the areas of conductive parts 1a and 2a are smaller than the opening area of the through-hole 3a formed in the spacer 3, and therefore, the conductive parts are settled inside the through-hole in the spacer and face each other. In the embodiment of FIG. 1A, the organic material 4 is filled in the entire through-hole, and in the embodiment of FIG. 5A, an air gap s1 is present between the organic material 4 and the conductive part 1a.

In the embodiment of FIGS. 1C and 5C, the areas of conductive parts 1a and 2a are smaller than the opening area of the through-hole 3a formed in the spacer 3, and therefore, the conductive parts are settled inside the through-hole in the spacer and face each other. In the embodiment of FIG. 1A, the organic material 4 is filled between the conductors facing each other, and in the embodiment of FIG. 5A, an air gap s1 is present between the organic material 4 and the conductive part 1a. In this case, to ensure electric insulation, (opening area of through-hole formed in spacer 3)>(contact area between conductive parts and organic material)≥(area of conductive parts 1a, 2a in through-hole) stands.

In the embodiment of FIG. 1C, an embodiment of (contact area between conductive parts and organic material)>(area of conductive parts 1a, 2a in through-hole) is preferable.

The embodiment of FIG. 1A is preferable since the conductive parts facing each other occupy the whole opening of the through-hole and the conductor area is wide, and insulation is easy to secure, and the embodiment of FIG. 1C is preferable since deformation of compressed organic material 4 in the lateral direction is not prevented by the spacer.

Figure 3:
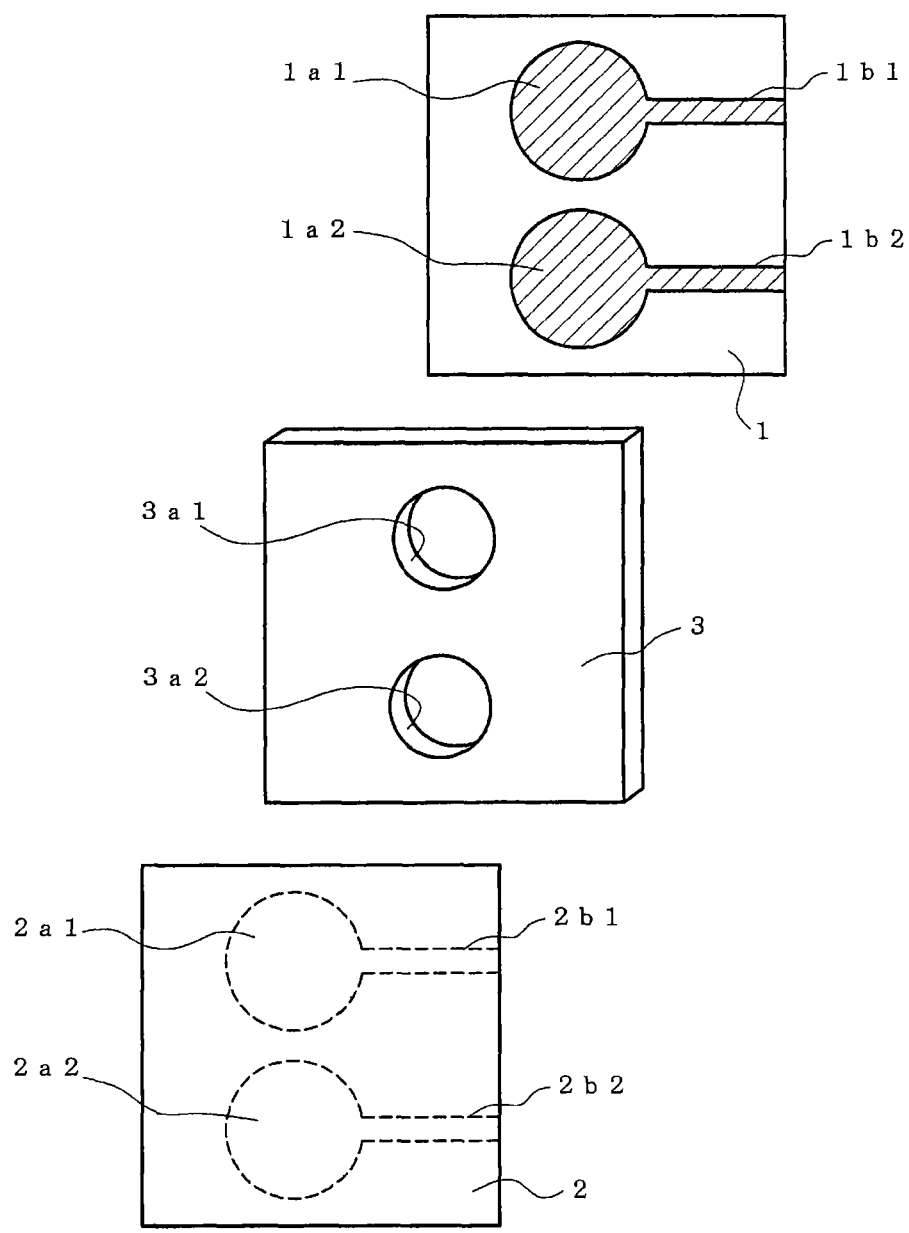

In the first and the second conductive parts, not only one pair but also plural pairs of conductive parts may be formed like an array, as in conventional membrane switches. While FIG. 3 shows the principal surface of each layer, an array structure may be employed, wherein plural first conductive parts (1a1, 1a2) are formed in a given arrangement pattern on the first substrate 1, plural first conductive parts (2a1, 2a2) are formed in the corresponding arrangement pattern on the second substrate 2, these conductive parts face each other with a space, and plural pairs of conductive parts are arranged on the surface. Spacer 3 is interposed between substrates so that a space will be secured between conductive parts of each pair of conductive parts, and an organic material showing piezoelectricity 4 (not shown) is filled or disposed to leave an air gap in the space between the conductive parts (inside of through-holes 3a1, 3a2 of spacer in FIG. 3) of each pair of the conductive parts.

In the array structure shown in FIG. 3, the spacer 3 also acts as a separation wall that electrically insulates in between pairs of conductive parts or in between lead wirings to the outside.

In the array structure shown in FIG. 3, the arrangement pattern and the pitch of the conductive parts on a substrate can be appropriately determined according to the object. For example, when a signal corresponding to the pressure of each part is obtained by placing the membrane switch in the surface layer of the article, the arrangement pattern of the conductor parts includes a pattern wherein a conductor is placed on the intersection of a network having a mesh shape of square, equilateral triangle, equilateral hexagon and the like. When the membrane switch is used as a switch of a keyboard having a predetermined key arrangement (keyboard of various types of electronic musical instrument (especially with pressure-sensitive function), keyboard of computer, controller of various devices, an input pad of game consoles), an arrangement pattern corresponding to the key sequence is employed.

The distance between the centers of the conductive parts in the array structure varies depending on the size of the product and is not limited. However, it is generally about 0.1 mm to 100 mm.

Figure 6A:
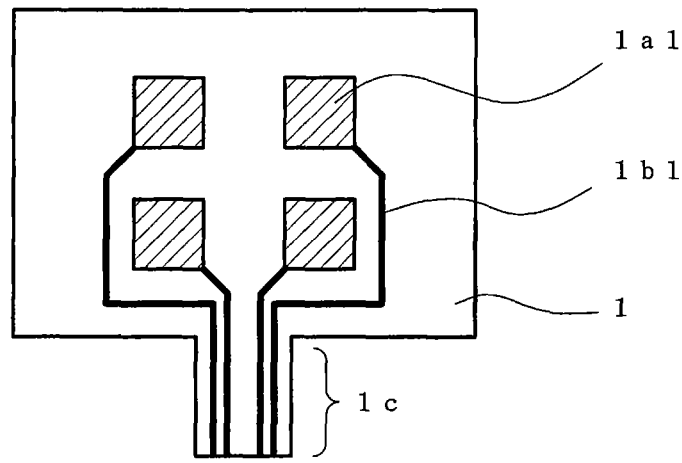
FIGS. 6A and 6B schematically show formation example of the conductive part, circuit and the like toward the substrate in the membrane switch of the present invention.
Figure 6B:
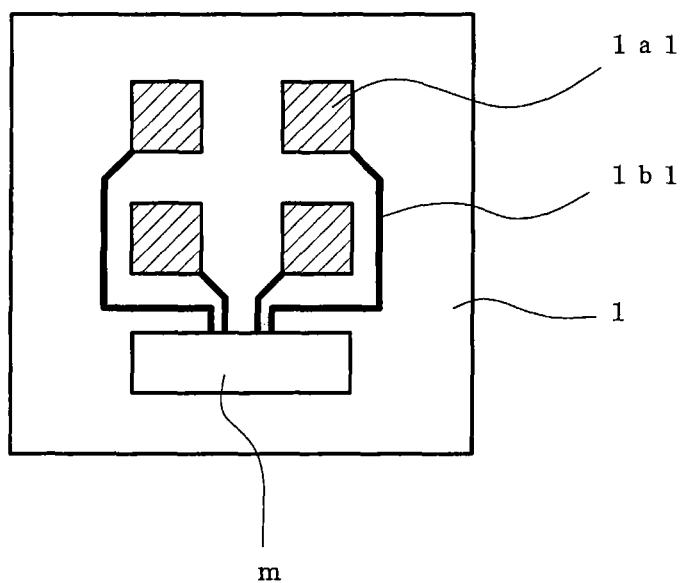

FIGS. 6A and 6B schematically show one embodiment of an arrangement pattern of a conductor and a wiring to be formed on a substrate surface (conductive parts of each switch and wiring connected thereto). In the Figures, the number of the conductive parts is set to 4 to simply the explanation. The pathway of the wiring is one example.

The outer peripheral shape of the substrate may be any suitable for use, such as square, rectangle, circular shape and the like. It is also possible to form, on the outer peripheral shape thereof, a connector part 1c topically extending to the outside as shown in FIG. 6A, and connect same to an external circuit (e.g., circuit having necessary function such as external device M shown in FIG. 2 and the like). Known techniques can be referred to for the structure of connector part 1c and a configuration to connect each switch to an external circuit.

For example, an embodiment wherein a wiring on a substrate is exposed (without forming a resist protective film), and the surface of the exposed wiring is plated with various metals such as Ni, Pd, Au and the like, an embodiment wherein a surface treatment such as a carbon paste and the like is applied to form a terminal, an embodiment wherein a commercially available connector is mounted on a substrate by soldering and the like, an embodiment wherein a connector part on the membrane switch side is conducted with an external circuit by solder, conductive paste, anisotropic conductive film (hereinafter ACF) and the like, and the like can be mentioned.

The membrane switch of the present invention and an external circuit do not always need to be separated and, as shown in FIG. 6B, a necessary external circuit m may be directly formed or mounted on the substrate of the membrane switch. The external circuit m in FIG. 6B may have a wiring part and many elements mounted thereon, or may be one IC chip integrating them. When IC chip is used as an external circuit m, an embodiment wherein it is mounted on the substrate wiring of the membrane switch (embodiment wherein external circuit m in FIG. 6B is the IC chip) is preferable.

The external circuit m in FIG. 6B may be a radio communication device for making communication with an external device. That is, the connection between the membrane switch and the external device does not always need to be a wired connection via a connector part, and may be a wireless connection by a radio wave or light.

Figure 8A:
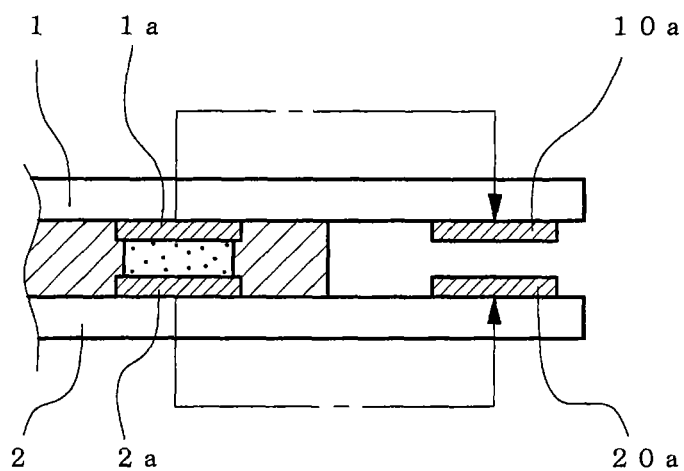
FIGS. 8A and 8B are cross-sectional views showing a configuration example of a terminal for connecting each conductive part on the substrate to a circuit, in the membrane switch of the present invention (connection example of conductive part and terminal).

When a connector part is formed on the membrane switch, as shown in FIG. 8A, wirings 10a, 20a of the connector parts formed on the first substrate 1 and the second substrate 2, respectively, may be separately connected to an external circuit.

Figure 8B:
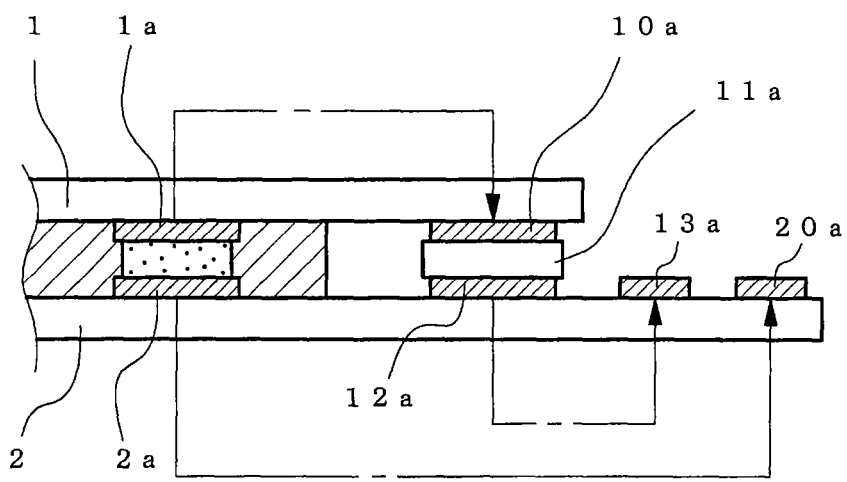

In FIGS. 8A and 8B, the connection relationship wherein the first conductive part 1a and the wiring 10a of the connector part are connected to each other by a wiring pattern on the first substrate surface is shown with an arrow of a dashed line. Similarly in the second substrate, the connection relationship by a wiring pattern on the substrate surface is shown with a dashed line.

In the example shown in FIG. 8B, wiring 10a on the first substrate is connected to wiring 12a on the second substrate via a conductive connection medium 11a, and further connected to wiring 13a of the connector part. In the example of this Figure, each wiring (13a, 20a) for all conductive parts (1a, 2a) on the first substrate 1 and the second substrate 2 gather in the connector part on the second substrate. In the embodiment shown in FIG. 8B wherein conductors gather on the substrate surface on one side is preferable since the structure of the connector becomes simple.

For electric connection between wiring on one substrate and wiring on the other substrate, a known connection technique can be used.

For example, in an embodiment shown in FIG. 8B wherein a conductive connection medium 11a is formed between both wirings facing each other, examples of the connection medium include electroconductive adhesive, ACF and the like. ACF is a preferable connection medium since it can connect fine-pitch wirings with high reliability.

Figure 9:
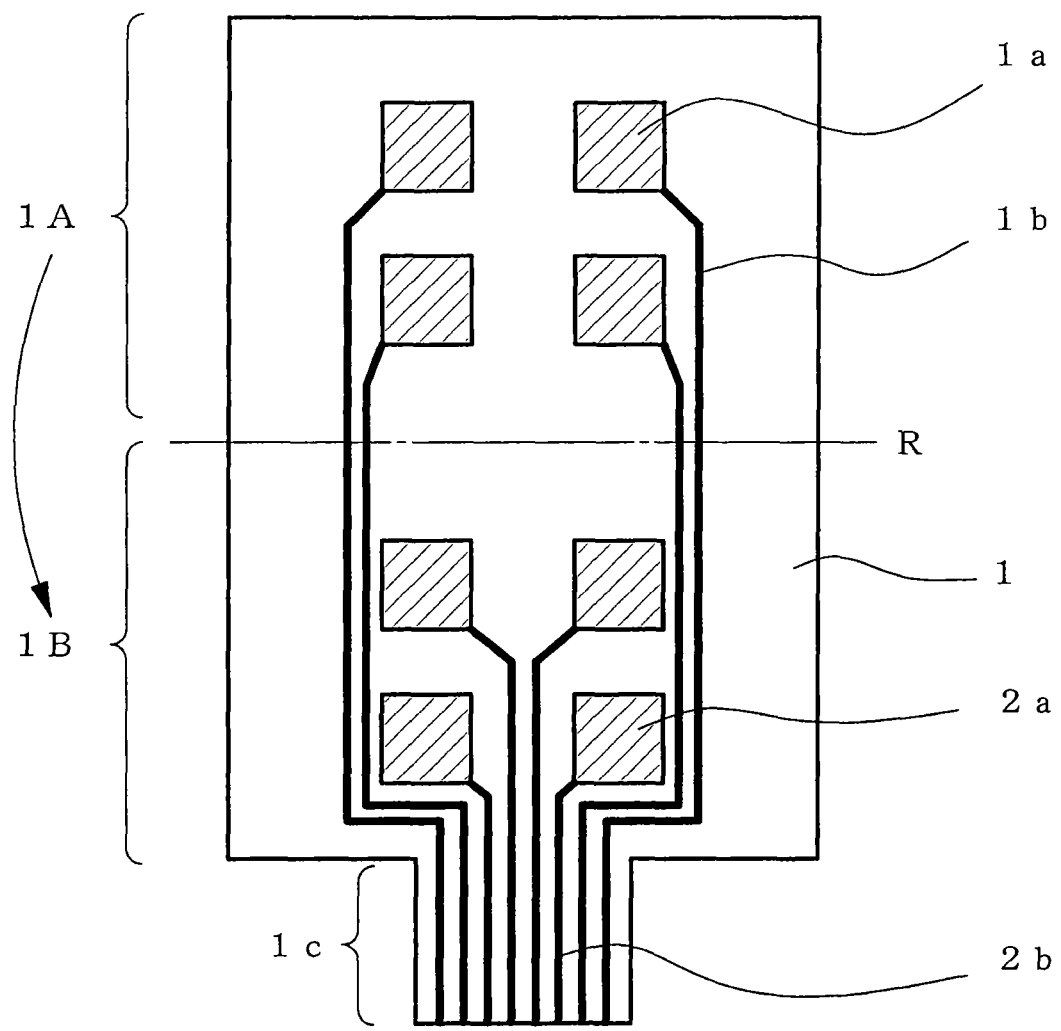
FIG. 9 schematically shows other configuration example of the conductive part, circuit and the like on the substrate in the membrane switch of the present invention.

As shown in FIG. 9, the first and the second conductive parts (1a, 2a) and wirings thereof (1b, 2b) may be formed in a given pattern on a single sheet of substrate, the wirings may be extended to one connector part 1c, and the single sheet of substrate may be folded into two along a folding line R to give the first and the second substrates. In this embodiment, wiring on one substrate and wiring on the other substrate are communicated with each other by a wiring pattern across the folding line R.

A measuring part included in the external circuit shown in FIGS. 2, 6A, and 6B may be any as long as it can measure voltage, electric charge, electric current, electrostatic capacity, resistance or change thereof between respective switches in the membrane switch, and outputting a signal corresponding to the pressure or force (load) from the outside that acted on each switch. Since the electric charge and electrostatic capacity change much according to the pressure or force acting on the switch, it is preferable to measure and output them. Also, since the signal of each switch is weak, it is preferable to incorporate an amplifier circuit in the measuring part.

Figure 7:
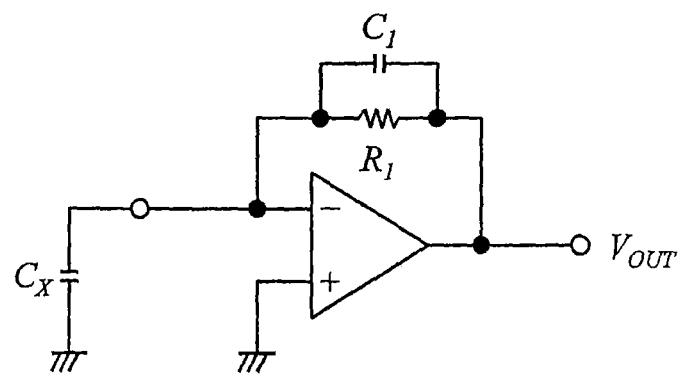
FIG. 7 shows one configuration example of an externally extracting circuit when utilizing the membrane switch of the present invention.

As the aforementioned measuring circuit and amplifier circuit, known art can be used. For example, as a circuit that amplifies and outputs an electric charge occurred in each switch by converting same to voltage by an integrating circuit, a circuit exemplified in FIG. 7 can be mentioned. In the embodiment of FIG. 7, $C_X$ shows the electrostatic capacity of each switch, $V_{out}$ shows output voltage, and $C_1$, $R_1$ show capacitor and resistance to be appropriately determined.

It is further preferable to incorporate an A/D conversion circuit in the measuring part to capture the signals converted to voltage by a computer. As an A/D conversion circuit, a known method can be used. Examples thereof include integrating-type, sequential comparison-type, flush-type, oversampling-type and the like.

It is also possible to add incidental circuits such as a noise rejection circuit, a soya tower circuit, a filtering circuit, a counting circuit, a count reset circuit, an indicating circuit, a memory circuit, a virtual ground circuit, various compensating circuits and the like as necessary.

The first and the second substrates may be any as long as they can support a conductive part, and preferable examples thereof include conventionally known materials of the substrate of a membrane switch and materials of the print wiring of a substrate. Such material is not particularly limited, and preferable examples thereof include polyimide-based resin, polyester-based resin, epoxide-based resin, urethane-based resin, polystyrene-based resin, polyethylene-based resin, polyamide resin, polyamideimide resin, acrylonitrile-butadiene-styrene (ABS) copolymer resin, polycarbonate-based resin, silicone-based resin, fluorine-based resin, liquid crystal polymer and the like, as well as composite materials such as paper phenol (composite material of paper impregnated with phenol resin), glass epoxy (composite material of a laminate of glass fiber cloth impregnated with epoxy resin) and the like.

Either one or both of the first and the second substrates may be formed by applying a liquid insulating material such as solder resist ink and the like and curing same.

The first and the second substrates material may be the same or different. To mount along the curved surface or surface layer of an article, it is preferable that either one or both of the first and the second substrates is/are formed from a material having flexibility. To impart the whole membrane switch with flexibility, both substrates are preferably formed from a material having flexibility. Of the above-mentioned materials, polyester-based resin is preferable since it is economical, has high transparency, and has appropriate flexibility. For use requiring heat resistance, size stability and flexibility, polyimide-based resin is preferable. While the flexibility is preferably the flexibility of the material itself, a substrate having flexibility of the substrate as a whole realized by adjusting the thickness is also included.

The thickness of each of the first and the second substrates can be determined according to the size of product, mechanical strength, flexibility and elasticity of material, and the like and is not particularly limited. When it is too thick, a problem of a failure to accurately convey pressure distribution to the organic material in each switch is developed, and when it is too thin, problems of easy breakage and lower durability are developed. In general, about 500 µm to 5 µm is widely used, among which about 200 µm to 10 µmm is more practical and preferable. For example, when the first and the second substrates materials are polyester, about 100 µm to 20 µm is a practically preferable range.

The first and the second substrates may have the same thickness or different thicknesses. For example, one of the substrates may be a fixed side having a thicker size, and the other substrate may be a movable side having a thinner size.

The outer peripheral shape of the first and the second substrates can be appropriately determined according to the number of required conductor pairs, sequence pitch of the conductor pair, and the size of the article to which a membrane switch is applied, and they may have the same shape or different shapes.

When a material having flexibility is used as the first and the second substrates, the flexibility of the material is not particularly limited, but preferably shows, for example, a tensile elastic modulus of less than 1 GPa and a tensile strain at break of not less than 10% by the tensile testing method regulated in JIS K7161, JIS K7162.

The material of the first and the second conductive parts may be conventionally known conductive materials used for a contact point of a membrane switch or wiring material of a printed wiring of a substrate, or any conductive material capable of preferably transmitting changes in the polarization of an organic material filled or disposed to leave an air gap between conductive parts to the outside.

As such conductive material, a good conductor metal simple substance such as gold, silver, copper, platinum, lead, tin, nickel, chrome and the like, or an alloy composed of two or more kinds of metals selected from these metals is a preferable material. Also, a preferable embodiment of the conductive part include one obtained by depositing a conductive paste containing a high concentration of the aforementioned metal fine particles (e.g., those referred to as metal nano particles and the like) or carbon particles, conductive polymer ink containing conductive ink, polythiophene and the like as a main component, and the like, by printing on a substrate, and performing drying, curing, baking and the like, and the like. In addition, transparent metal oxides such as indium tin oxide (ITO), fluorine-doped tin oxide (FTO) and the like are also preferable materials when the membrane switch transparent as a whole is desired.

A known surface modification may be applied to the surface of a conductive part and a circuit part to improve wear resistance, rust prevention or close adhesion, or a conductive part as formed may be used as is. As known surface modification, plating with Ni, Pd, Au and the like, a rust prevention treatment using a nonconductor layer or organic layer, and the like can be mentioned.

The outer peripheral shape of each conductive part is not particularly limited, and the circular shape shown in FIG. 3, square, rectangle, other polygon, and the like can be mentioned. A circular shape is a preferable shape in view of production cost, prevention of crack, and force sensing.

The outer peripheral shape of the first and the second conductive parts constituting a pair of conductive parts is preferably identical when one of them is projected on the other. However, it does not apply to a lead wiring (corresponding to 2 in FIGS. 6A and 6B) connecting the conductive parts and an external circuit.

While the size of the outer peripheral shape of each conductive part (area in the substrate principal surface) can be appropriately determined according to the size and use of a membrane switch, the diameter of a circular outer peripheral shape is, for example, preferably about 0.1 µm to 500 mm, more preferably 0.1 mm to 100 mm. When the outer peripheral shape of the conductive part is other than a circular shape, the size thereof is preferably an area corresponding to that of a circular shape having a diameter of about 0.1 µm to 500 mm, more preferably about 0.1 mm to 100 mm.

While the thickness of each conductive part varies depending on the size, material, and formation method of product, it is generally about 0.1 µm to 100 µm. For example, when it is formed by printing a conductive paste, conductive ink and the like, about 5 µm to 50 µm is preferable; when it is formed by metal foil or plating, about 5 µm to 50 µm is preferable; and when it is formed by vapor deposition or sputtering, about 10 nm to 5 µm is preferable.

The distance between conductive parts may be a value capable of preferably detecting the piezoelectricity shown by an organic material. A smaller value is preferable for flexibility and usability, and a larger value is preferable for secured insulation. The distance is, for example, preferably 3 µm to 500 µm, more preferably 5 µm to 100 µm.

When plural pairs of conductive parts are set to form an array structure as in the embodiment of FIG. 3, conductive parts of each pair of conductive parts may be connected to each other as a single conductive layer spread on a substrate surface and having a common electric potential, rather than an individually separated and independent conductive parts. Even in such embodiment, an array structure having plural pairs of conductive parts arranged therein can be obtained as long as the other conductive parts are individually and independently separated and they are insulated from each other.

As a method of forming a conductive part on the first and the second substrates, a conventionally known method of forming a contact point in a membrane switch or a method of forming a wiring circuit in a printed circuit board can be utilized. Examples thereof include the additive method, the semi-additive method, and the subtractive method shown below as examples.

A method of forming a conductive part, including depositing a conductive paste or conductive ink on a substrate by printing to form a shape of a conductive part, followed by drying, curing, baking and the like.

A method of removing an unnecessary seed layer, including forming a seed layer by electroless plating, sputter, vapor deposition and the like, forming a wiring by electric plating using a resist and removing an unnecessary seed layer.

A method including etching a conductive layer formed on the entire substrate by adhering metal foil, sputtering and vapor deposition of a metal, ITO and the like, and the like, to leave a conductive part.

Of these methods, the subtractive method is a preferable method from the aspects of the balance of productivity (low cost) and reliability.

The first conductive part and the second conductive part may be made from the same material or different materials.

A wiring circuit for connecting each conductive part and an external circuit is formed on the first and the second substrates. In the example of FIG. 3, wiring circuits (1*b*1, 1*b*2) respectively connected to conductive parts (1*a*1, 1*a*2) are formed on the first substrate 1, and wiring circuits (2*b*1, 2*b*2) respectively connected to conductive parts (2*a*1, 2*a*2) are formed on the second substrate 2.

A wiring circuit may be formed not only the surface on which the conductive parts are formed, but also on the backside thereof or inside of the substrate. In this case, for conductive path, through hole, via and the like connecting a wiring circuit and a conductive part are formed in the thickness direction of the substrate.

The material and the formation method of the wiring circuit may be the same as those of the above-mentioned conductive parts. In view of productivity and simple structures, it is preferable to form the conductive parts and the wiring circuit at once on the same face of the substrates by using the same material and the same formation method.

One embodiment for forming a conductive part and a wiring circuit respectively on the first and the second substrates by a printing method is as follows:

Using a polyethylene terephthalate film as a substrate, a conductive part and a wiring circuit pattern connected thereto are drawn on the substrate by screen printing using a silver paste for printing circuit. The substrate with a conductive part and a wiring circuit drawn thereon is dried by heating in an oven for a given time to give a substrate having a conductive part and a wiring circuit formed thereon. This method is superior in the balance of productivity (low cost) and reliability.

One embodiment for forming a conductive part and a wiring circuit respectively on the first and the second substrates by photolithography is as follows:

A three-layer type polyimide copper-clad laminate plate (3-layer laminate wherein copper foil is laminated on a polyimide resin film via an adhesive layer (epoxy adhesive layer and the like)) is prepared, a dry film resist is laminated on the surface of the copper foil, the laminate is exposed and developed in such a manner that only a conductive part to be formed and a wiring circuit are covered with the dry film resist. This is etched using iron chloride or copper chloride, and the exposed copper foil is removed leaving only the object conductive part and wiring circuit. Lastly, the dry film resist is removed to give a substrate having the conductive part and the wiring circuit formed thereon. This method is suitable for the production of a product required to have good quality, since copper foil is an electrically and mechanically superior conductor, showing high adhesion to substrate and high heat resistance, and fine pattern processing is possible. Moreover, it is advantageous since the surface of the wiring circuit is flat, and insulation can be secured even when an organic material showing piezoelectricity has a thin layer.

The spacer may be any as long as it is interposed between the first and the second substrates and supports the first and the second substrates so that a space can be formed between the conductive parts. An embodiment wherein the spacer annularly surrounds the periphery of the space between the conductive parts (i.e., embodiment wherein a film to be the spacer has a through-hole 3*a* as in FIGS. 1A, 1B, and 1C, and conductive parts face each other over a space part in the through-hole) is preferable, since the spacer can be formed easily, the first and the second substrates can be supported with good balance, and neighboring conductor pairs can be insulated. However, it may also be discretely formed as an independent supporting column on the periphery of one pair of conductive parts. In this case, as mentioned above, a space part free of a spacer material is the through-hole.

The material of the spacer may be rigid. However, it preferably has suitable elasticity and flexibility so that the spacer will not prevent the pressure to be applied to the conductive parts, and flexibility can be conferred to the whole membrane switch, and low elasticity permitting compression even with a small force is preferable.

While the elasticity and flexibility of the material of the spacer are not particularly limited, they preferably show, for example, a tensile elastic modulus of less than 1 GPa and a tensile strain at break of not less than 10% by the tensile testing method regulated in JIS K7161 and JIS K7162.

The material of the spacer is preferably an insulating material to electrically insulate the adjacent pair of conductive parts.

Examples of the above materials include polymer materials such as polyester, polycarbonate, polyimide, vinyl chloride, polyurethane and the like. From the aspects of flexibility, elastic modulus, cost, and heat resistance, polyester is a more preferable material.

The material of the spacer may be a cured liquid insulating material such as solder resist ink and the like, or the same material as the liquid insulating material, such as solder resist ink and the like, used for the substrate.

The opening shape of the through-hole formed in the spacer is not particularly limited. In the embodiment of FIGS. 1A, 1B, and 1C, it is preferably a shape similar to the outer shape of the conductive parts. Therefore, the circular shape shown in FIG. 3, as well as square, rectangle, polygon, irregular shape and the like are preferable shapes. The through-hole to be formed in the spacer may be connected to a passage for air release on injection of an organic material showing piezoelectricity.

The thickness of the spacer can be appropriately determined in consideration of the thickness of the conductive parts, so that the designed distance between conductive parts can be obtained. For example, in the example of FIGS. 1A, 1B, and 1C, (spacer thickness)=(conductive part thickness× 2)+(distance between conductive parts) stands.

The conductive parts and the above-mentioned organic material do not always need to be closely adhered and, as shown in FIGS. 5A, 5B, and 5C, air gap s1 may be present. In this case, (spacer thickness)>(conductive part thickness× 2)+(organic material thickness) stands.

The distance between the conductive parts is preferably 3 µm to 500 µm, as mentioned above.

While a method of forming spacer 3 having through-holes 3*a*1, 3*a*2 as in FIG. 3 is not particularly limited, the following exemplary methods can be mentioned.

A method of forming a sheet-like molded part having a through-hole by using a resin molding die, such as extrusion molding, injection molding and the like.

A method including preparing a film with an object thickness from a spacer material, forming a through-hole with a given opening shape at a predetermined position by punching (blanking) to give a spacer (method of the below-mentioned (A)).

A method including printing a region where a spacer is to be formed on the first or the second substrate having a conductive part and a wiring circuit formed thereon with ink of an insulating material, and curing same to give a spacer. In this case, it is necessary to print the ink while leaving an opening corresponding to the through-hole. The opening may be formed by pattern formation using a known printing method such as screen printing, gravure coating, ink-jet and the like (method of the below-mentioned (B)). The opening may also be formed by overall printing by roll coating and the like using a photosensitive material as the ink, followed by exposure and development and removal of the ink later.

Of the above-mentioned methods, the method including preparing a film with an object thickness (thickness necessary as a spacer) from a spacer material, and forming a through-hole with a given opening shape at a predetermined position by punching to give a spacer is preferable from the aspects of productivity and cost. However, the size precision tends to be somewhat rough due to the process of punching out a film with flexibility and elasticity with a metal mold. In contrast, the method of forming a spacer by pattern printing, and exposure and development, is expensive as compared to the punching method from the aspects of material costs and processing labor. However, it is advantageous as compared to the aforementioned punching, since highly close adhesion to the printed surface can be obtained, and a fine structure can be formed as compared to punching and the like.

When a spacer is formed as a separate sheet-like formed part by forming, molding, punching and the like, known laminate techniques can be referred to as regards an assembly method of the membrane switch. Examples thereof include a method including forming an adhesive layer between a spacer and a substrate to give a laminate thereof, a method including adhesion by punching and the like, and the like.

The adhesive may be any of pressure-sensitive adhesive, photosensitive adhesive, heat curable adhesive and the like, and a preferable material includes thermoplastic resin, epoxide-based resin, acrylic resin, silicone resin, polyimide resin, natural rubber, synthetic rubber and the like.

Adhesion with an adhesive may be applied to the whole surface, or a partial region of the spacer.

(A) A more specific Production Example of a membrane switch when a spacer is formed as a separate sheet-like formed part and adhered to a substrate is as follows:

As a spacer, a 5-layer laminate wherein (a release sheet for overlapping, an adhesive layer, polyethylene terephthalate layer to be a spacer, an adhesive layer, a release sheet for overlapping) are laminated in advance in this order is prepared, which is subjected to punching and processing to form an object through-hole. The size and position of the through-hole can be determined according to the size and position of a given space to be formed between conductive parts facing each other.

A release sheet on one side is peeled off, and the laminate is adhered to the substrate such that the contact point on one substrate matches the opening of the through-hole formed in the spacer.

Then, an organic material showing piezoelectricity is filled or disposed to leave an air gap in the through-hole in the spacer.

Then, a release sheet of the other surface of the spacer is peeled off, the conductive part on the other substrate and the opening of the through-hole formed in the spacer are positioned, adhered to each other to give a membrane switch.

(B) Formation example of a spacer when the spacer is formed on a substrate by printing is as follows:

An insulating ink layer is formed by screen printing on one substrate surface, on which a conductive part and a wiring circuit have been formed, while surrounding the periphery of the conductive part, whereby a through-hole is formed. This is subjected to drying and curing in an oven for a given time to give a spacer layered on a substrate.

In this case, an insulating material such as solder resist ink and the like may be used as a spacer material as mentioned above.

The organic material showing piezoelectricity to be filled or disposed to leave an air gap between conductive parts in the present invention may be a single material, a mixed material, or a composite material. When it is a mixed material or a composite material, each substance to be the component does not always need to have piezoelectricity, and an organic material as a whole only needs to show piezoelectricity. To be specific, the following materials (a)-(c) can be mentioned.

(a) an organic piezoelectric substance having piezoelectricity by itself (single material or mixed materials), (b) a composite material comprising a base material composed of an organic piezoelectric substance having piezoelectricity by itself, and a filler made of other material having piezoelectricity by itself and dispersed in the base material, which composite material as a whole being an organic material showing piezoelectricity different from the piezoelectricity of the base material, and (c) a composite material comprising a base material composed of an organic material without having piezoelectricity and a filler made of a material having piezoelectricity by itself and dispersed in the base material, which composite material as a whole being an organic material showing piezoelectricity.

The organic piezoelectric substance of the above-mentioned (a) is a concept including both (a1) an organic compound showing piezoelectricity due to the chemical structure of a molecule thereof, and (a2) an organic compound not showing piezoelectricity based on the chemical structure of a molecule thereof, but expressing piezoelectricity acquired by processing thereof (processing not changing the chemical structure of the molecule).

Since an organic piezoelectric substance is an organic compound, it has flexibility and molding processability that are absent in inorganic materials general known as a ferroelectric substance such as lead zirconate titanate (PZT) and the like, is light weight, and is superior in costs (see JP-B-62-4873).

Although PZT, which is a general inorganic ferroelectric substance, contains a large amount of lead which is harmful for the human body and environment, since an organic piezoelectric substance does not contain lead, it is beneficially less detrimental on the human body and environment.

However, while many reports on the ferroelectricity of organic piezoelectric substances, particularly an organic ferroelectric substance, have been documented, the structure of the element has not been studied much, and the element under study has a complicated structure to result in a very high cost of the element (see JP-A-H10-332509, JP-A-2009-53109, which are incorporated herein by reference in their entireties). Furthermore, an element having a structure for separately sensing the pressure applied on plural points in a surface by using an organic piezoelectric substance has scarcely been studied.

Examples of the organic compound of the above-mentioned (a1) include polyvinylidene fluoride, vinylidene fluoride/trifluoroethylene copolymer, poly(amino acid), polylactic acid, triglycine sulfate, polyurea, nylon, ferroelectric liquid crystal, croconic acid and the like. Only one kind of these may be used, or a mixture of two or more kinds thereof may be used. Examples of the organic compound of the above-mentioned (a2) include porous resins such as porous polyolefin and the like (e.g., porous resin described in JP-A-2012-124434 which is incorporated herein by reference in its entirety).

Of these organic piezoelectric substances, poly(amino acid) is a particularly preferable material from the aspects of good processability permitting filling or disposing to leave an air gap between conductive parts by printing technique, and good piezoelectricity property. The detail of the preferable poly(amino acid) is as mentioned below.

The composite material of the above-mentioned (b) as an organic material showing piezoelectricity is the organic piezoelectric substance of the above-mentioned (a) as a base material and further containing particulate filler made of other material having piezoelectricity dispersed therein. Examples of the material of the filler include organic piezoelectric substance of the above-mentioned (a) (material different from the base material), lead zirconate titanate (PZT), natural or artificial quartz crystal, lithium niobate (LiNbO$_3$), potassium tantalate niobate [K(Ta,Nb)O$_3$], barium titanate (BaTiO$_3$), lithium tantalite (LiTaO$_3$), and inorganic ferroelectric substances such as strontium titanate (SrTiO$_3$) and the like.

The particle size of the filler may be, for example, Feret diameter (distance between two parallel lines in a fixed direction, the lines having a particle in between) of a particle image obtained under a microscope (also called diameter in a fixed direction). While the particle size of the filler is not particularly limited, it preferably does not prevent elasticity of the base material and flowability before curing. For example, the average particle size is about 100 nm to 5 μm.

While the content of the filler in the composite material is not particularly limited, when it is small, the piezoelectricity thereof is not expressed, and when it is too high, the flexibility and processability as an organic material are impaired. Therefore, it is preferably 5 to 90 wt %, more preferably 10 to 80 wt %.

The composite material of the above-mentioned (c) as an organic material showing piezoelectricity is an organic material free of piezoelectricity as a base material and further containing a filler similar to that in the above-mentioned (b) dispersed therein. The organic material free of piezoelectricity may be a general resin, elastomer and the like, and examples thereof include thermosetting resins such as epoxy resin, acrylic resin, phenol resin, polyurethane resin and the like, elastomers such as natural rubber, acrylic rubber, nitrile rubber, butadiene rubber and the like, and the like.

While the content of the filler in the composite material is not particularly limited, when it is small, the piezoelectricity thereof is not expressed, and when it is too high, the flexibility and processability as an organic material are impaired. Therefore, it is preferably 5 to 90 wt %, more preferably 10 to 80 wt %.

The organic materials showing the above-mentioned piezoelectricity (organic piezoelectric substances of the above-mentioned (a)-(c)) can optionally contain, as long as the effects of piezoelectric substance and ferroelectric substance can be exhibited, other various resins and additives other than those mentioned above, to improve the properties. Examples of the resin additive include inorganic fillers such as silica, talc, barium sulfate and the like, colorants such as pigment, dye and the like, organic fillers such as carbon black, silicon powder, nylon powder, fluorine powder, rubber particles and the like, thickeners such as Oruben, Benton and the like, antifoaming agents such as silicone-based, fluorine-based, polymer-based or leveling agents, vinylbenzylether resins such as epoxy resin, acrylic resin, phenol resin, polyurethane resin and the like, maleimide compound, bisallylnadiimide compound, thermosetting resin, vinylbenzyl resin, adhesiveness-imparting agents such as triazole compound, thiazole compound, triazine compound, porphyrin compound and the like, and the like.

The organic material contained between conductors in the membrane switch of the present invention may be subjected to a pre-treatment to express piezoelectricity, or a polarization treatment to increase piezoelectricity.

Examples of the pre-treatment to express piezoelectricity include a treatment to trap electric charge by corona discharge and the like. Examples of the polarization treatment include a treatment to apply a direct-current voltage in between conductive parts sandwiching an organic material, for a given time by using a high-voltage direct-current and a constant voltage power source and the like. The polarization treatment may be performed without heating (e.g., normal temperature at about 5° C. to 35° C.) or under heating. When the polarization treatment is performed under heating, the heating temperature is preferably about the glass transition point of the target organic material. When the organic material is a composite material, the glass transition point of the organic material to be the base material is a preferable heating temperature, though subject to change depending on the combination of the materials.

While a force from the outside which can be detected by the membrane switch of the present invention can vary depending on the size of each part of the membrane switch such as the distance between conductive parts, contact area between conductive parts and organic material and the like, in a general use where the membrane switch is useful, the pressure to be detected is about 0 MPa to 0.1 MPa.

[Poly α-Amino Acid]

Poly(α-amino acid) particularly preferable as the organic piezoelectric substance of the above-mentioned (a) is explained in detail below.

Such poly(α-amino acid) may be a poly(α-amino acid) containing one or more kinds of units selected from glycine, alanine, valine, leucine, isoleucine, arginine, asparagine, aspartic acid, cystine, cysteine, glutamine, glutamic acid, histidine, lysine, ornithine, serine, threonine, tryptophan, methionine, phenylalanine, tyrosine and a derivative thereof. Among these, a poly(α-amino acid) containing one or more kinds of units selected from arginine, asparagine, aspartic acid, glutamine, glutamic acid, histidine, lysine, serine, threonine, tryptophan, tyrosine and a derivative thereof is preferable from the aspect of solubility, and more preferable examples thereof include homopolymers and copolymers of the poly(α-amino acid) containing one or more kinds of units selected from glutamic acid, aspartic acid, lysine and a derivative thereof.

The following poly(α-amino acid) is preferable from the aspects of solubility and piezoelectric property.

Poly(α-amino acid) containing one or more kinds of units selected from a unit represented by the formula (I):

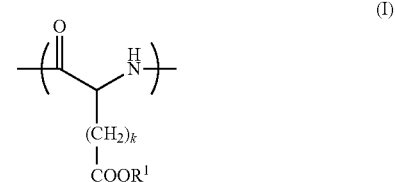

wherein k is an integer of 1 or 2, $R^1$ is a $C_1$-$C_8$ substituted or unsubstituted alkyl group, or a benzyl group optionally substituted by a halogen atom, an alkoxy group or a nitro group (hereinafter to be also abbreviated as "unit of the formula (I)"), a unit represented by the formula (II):

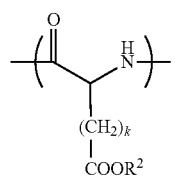

(II)

wherein k is an integer of 1 or 2, and $R^2$ is a $C_3$-$C_{16}$ unsubstituted alkyl group or a $C_1$-$C_6$ alkyl group wherein a part of or all hydrogen atoms are substituted by a halogen atom, a $C_3$-$C_{12}$ alicyclic hydrocarbon group, a $C_1$-$C_6$ alkoxy group, a cyano group, a phenyl group optionally having substituent(s), a phenylalkoxy group optionally having substituent(s) or a phenylalkylcarbamate group optionally having substituent(s), provided that $R^2$ is not the same group as $R^1$ in the formula (I) (hereinafter to be also abbreviated as "unit of the formula (II)"), a unit represented by the formula (III):

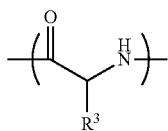

(III)

wherein $R^3$ is a methyl group, a benzyl group or a —$(CH_2)_4$—NHX group, provided that X is a benzyloxycarbonyl group optionally substituted by a halogen atom or a $C_1$-$C_6$ alkoxy group, a $C_1$-$C_6$ alkylcarbonyl group optionally substituted by a halogen atom, an allyloxycarbonyl group, a fluorenylalkoxycarbonyl group, a benzenesulfonyl group optionally substituted by a $C_1$-$C_6$ alkyl group or a nitro group, or a $C_1$-$C_6$ alkyloxycarbonyl group, (hereinafter to be also abbreviated as "unit of the formula (III)"), a unit represented by the formula (IV):

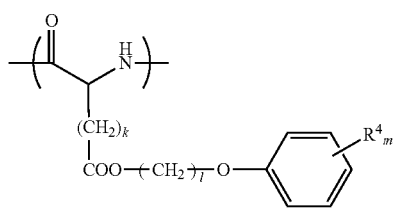

(IV)

wherein k is an integer of 1 or 2, $R^4$ is a $C_1$-$C_{12}$ alkoxy group, a $C_1$-$C_{12}$ alkyl group wherein a part of or all hydrogen atoms are by a halogen atom, or a $C_1$-$C_{12}$ alkylcarbonyl group, $R^4$ in the number of m may be the same or different, l is an integer of 6-12, and m is an integer of 1-3, (hereinafter to be also abbreviated as "unit of the formula (IV)"), and a unit represented by the formula (V):

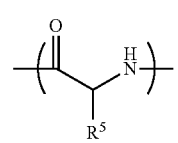

(V)

wherein $R^5$ is a hydrogen atom, a methyl group, —CH(OH)CH$_3$, a $C_3$-$C_4$ branched chain alkyl group, or —$(CH_2)_n$—Z, provided that n is an integer of 1-4, Z is a hydroxy group, a mercapto group, a carboxy group, a methylsulfanyl group, an amino group, a substituted aryl group, an aminocarbonyl group, —NH—C(NH$_2$)=NH,

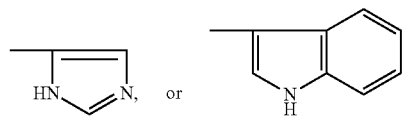

(hereinafter to be also abbreviated as "unit of the formula (V)").

Each unit of formula (I)-formula (V) is explained in detail below.

Unit of the Formula (I).

The unit of the formula (I) is a glutamic acid γ-ester unit or an aspartic acid γ-ester unit.

$R^1$ in the formula is a $C_1$-$C_8$ substituted or unsubstituted alkyl group, or a benzyl group optionally substituted by a halogen atom, an alkoxy group or a nitro group.

The "$C_1$-$C_8$ alkyl group" is a linear or branched chain alkyl group. Examples thereof include a methyl group, an ethyl group, a n-propyl group, a n-butyl group, a n-pentyl group, a n-hexyl group, a n-heptyl group, a n-octyl group, an isopropyl group, a sec-butyl group, a tert-butyl group, a 2-methylbutyl group, a 3-ethylbutyl group, a 4-ethylbutyl group, a 2-methylpentyl group, a 3-methylpentyl group, a 4-methylpentyl group, a 5-methylpentyl group, a 2-methylhexyl group, a 3-methylhexyl group, a 4-methylhexyl group, a 5-methylhexyl group, a 6-methylhexyl group, a 3-ethylhexyl group, a 4-ethylhexyl group, a 5-ethylhexyl group, a 6-ethylhexyl group, a 2-methylheptyl group, a 3-ethylheptyl group, a 4-propylheptyl group, a 2,3-dimethylbutyl group, a 2,4-dimethylbutyl group, a 4,4-dipropylbutyl group, a 2-methyl-3-ethylpentyl group, a 2,3,4-trimethylpentyl group and the like. Preferred is a $C_1$-$C_6$ alkyl group, and more preferred is a $C_1$-$C_3$ alkyl group. A methyl group or an ethyl group is particularly preferable, and a methyl group is most preferable.

While a part of or all hydrogen atoms in the "$C_1$-$C_8$ alkyl group" are optionally substituted, the group is preferably unsubstituted. When it has a substituent, examples of the substituent include a halogen atom (fluorine atom, chlorine atom, bromine atom, iodine atom etc.), an alkoxy group (preferably $C_1$-$C_6$ alkoxy group (e.g., methoxy group, ethoxy group, n-propoxy group, n-butoxy group, n-pentyloxy group, n-hexyloxy group, methylenedioxy group etc.)) and the like.

In the "benzyl group optionally substituted by a halogen atom, an alkoxy group or a nitro group", examples of the "halogen atom" include a fluorine atom, a chlorine atom, a bromine atom, an iodine atom and the like. Among these, a fluorine atom, a bromine atom or a chlorine atom is preferable. The "alkoxy group" is a linear, branched chain or cyclic alkoxy group, and preferred is a $C_1$-$C_6$ an alkoxy group (e.g., methoxy group, ethoxy group, n-propoxy group, n-butoxy group, n-pentyloxy group, n-hexyloxy group, and methylenedioxy group etc.), more preferred are a methoxy group, an ethoxy group, a n-propoxy group, and a methylenedioxy group, and particularly preferred is a methoxy group.

Preferable examples of the "benzyl group optionally substituted by a halogen atom, an alkoxy group or a nitro group" include a p-bromobenzyl group, a p-chlorobenzyl group, a p-fluorobenzyl group, a p-methoxybenzyl group, a 2,6-dimethoxybenzyl group, a 3,4-methylenedioxybenzyl group, an o-nitrobenzyl group, a p-nitrobenzyl group, a 2-nitro-4,5-dimethoxybenzyl group, and a benzyl group. Of these, a p-methoxybenzyl group, a p-nitrobenzyl group, and a benzyl group are more preferable, and a benzyl group is particularly preferable.

Preferable embodiments of $R^1$ are a methyl group or a benzyl group.

Unit of the Formula (II).

The unit of the formula (II) is a glutamic acid γ-ester unit or an aspartic acid γ-ester unit.

$R^2$ in the formula is a $C_3$-$C_{16}$ unsubstituted alkyl group, or a $C_1$-$C_6$ alkyl group wherein a part of or all hydrogen atoms are substituted by a halogen atom, a $C_3$-$C_{12}$ alicyclic hydrocarbon group, a $C_1$-$C_6$ an alkoxy group, a cyano group, a phenyl group optionally having substituent(s), a phenylalkoxy group optionally having substituent(s) or a phenylalkylcarbamate group optionally having substituent(s), provided that $R^2$ in the formula is not the same group as $R^1$ in the formula (I).

The "$C_3$-$C_{16}$ unsubstituted alkyl group" is a linear or branched chain alkyl group. Examples thereof include an n-propyl group, an n-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, a 3-ethylbutyl group, a 4-ethylbutyl group, a 2-methylpentyl group, a 3-methylpentyl group, a 4-methylpentyl group, a 5-methylpentyl group, a 2-methylhexyl group, a 3-methylhexyl group, a 4-methylhexyl group, a 5-methylhexyl group, a 6-methylhexyl group, a 3-ethylhexyl group, a 4-ethylhexyl group, a 5-ethylhexyl group, a 6-ethylhexyl group, a 4-propylhexyl group, a 5-propylhexyl group, a 6-propylhexyl group, a 5-butylhexyl group, a 6-butylhexyl group, a 6-pentylhexyl group, a 2-methylheptyl group, a 3-ethylheptyl group, a 4-propylheptyl group, a 5-butylheptyl group, a 6-pentylheptyl group, a 7-hexylheptyl group, a 2-methyloctyl group, a 3-ethyloctyl group, a 4-propyloctyl group, a 5-butyloctyl group, a 6-pentyloctyl group, a 7-hexyloctyl group, an 8-heptyloctyl group, a 2-methylnonyl group, a 3-ethylnonyl group, a 4-propylnonyl group, a 5-butylnonyl group, a 6-pentylnonyl group, a 7-hexylnonyl group, an 8-heptylnonyl group, a 2-methyldecyl group, a 2-methylundecyl group, a 2-methyldodecyl group, a 2-methyltridecyl group, a 2-methyltetradecyl group, a 2-methylpentadecyl group, a 3,3-diethylpropyl group, a 2,3-dimethylbutyl group, a 2,4-dimethylbutyl group, a 4,4-dipropylbutyl group, a 2-methyl-3-ethylpentyl group, a 2,3,4-trimethylpentyl group, a 2-methyl-3-propylhexyl group and the like.

As such "$C_3$-$C_{16}$ unsubstituted alkyl group", a "$C_6$-$C_{16}$ unsubstituted alkyl group" is preferable, a "$C_6$-$C_{16}$ linear unsubstituted alkyl group" is more preferable, a "$C_6$-$C_{12}$ linear unsubstituted alkyl group (that is, n-hexyl group, n-heptyl group, n-octyl group, n-nonyl group, n-decyl group, n-undecyl group, n-dodecyl group etc.)" is further preferable, and an n-hexyl group or an n-dodecyl group is particularly preferable.

In the "$C_1$-$C_6$ alkyl group wherein a part of or all hydrogen atoms are substituted by a halogen atom, a $C_3$-$C_{12}$ alicyclic hydrocarbon group, a $C_1$-$C_6$ alkoxy group, a cyano group, a phenyl group optionally having substituent(s), a phenylalkoxy group optionally having substituent(s) or a phenylalkylcarbamate group optionally having substituent(s)", the "$C_1$-$C_6$ alkyl group" is a linear or branched chain alkyl group. Examples thereof include a methyl group, an ethyl group, an n-propyl group, an n-butyl group, an n-pentyl group, an n-hexyl group, an isopropyl group, a sec-butyl group, a tert-butyl group, a 2-methylbutyl group, a 3-ethylbutyl group and the like. The "$C_1$-$C_6$ alkyl group" is preferably a "$C_1$-$C_3$ alkyl group (e.g., methyl group, ethyl group, n-propyl group, isopropyl group)", more preferably a methyl group or an ethyl group.

Examples of the "halogen atom" include a fluorine atom, a chlorine atom, a bromine atom, an iodine atom and the like. Of these, a fluorine atom, a bromine atom, and a chlorine atom are preferable.

The "$C_3$-$C_{12}$ alicyclic hydrocarbon group" is a saturated or unsaturated alicyclic hydrocarbon group. Examples thereof include a cyclopropyl group, a cyclobutyl group, a cyclopentyl group, a cyclohexyl group, a cycloheptyl group, a cyclooctyl group, a cyclononyl group, a cyclodecyl group, a decahydronaphthyl group, a norbornyl group, an adamantyl group, an isobornyl group and the like. The "$C_3$-$C_{12}$ alicyclic hydrocarbon group" is preferably a "$C_6$-$C_8$ saturated alicyclic hydrocarbon group (that is, cyclohexyl group, cycloheptyl group, cyclooctyl group, norbornyl group)", more preferably a cyclohexyl group or an norbornyl group, and further preferably an norbornyl group.

The "$C_1$-$C_6$ alkoxy group" may be linear or branched chain, is preferably a linear alkoxy group, and may contain an ether bond in the alkyl chain. Examples thereof include a methoxy group, an ethoxy group, an n-propoxy group, an n-butoxy group, an n-pentyloxy group, an n-hexyloxy group, an n-methoxyethoxy group, an n-ethoxyethoxy group, an n-methoxyethoxyethoxy group and an n-ethoxyethoxyethoxy group, preferably a methoxy group, an ethoxy group or an n-propoxy group, and more preferably an ethoxy group.

The "phenyl group optionally having substituent(s)" is an unsubstituted phenyl group or a phenyl group wherein a part of or all hydrogen atoms are substituted by a halogen atom (fluorine atom, chlorine atom, bromine atom, iodine atom etc.), a $C_1$-$C_6$ alkoxy group and the like. Examples thereof include a phenyl group, a p-fluorophenyl group, a p-chlorophenyl group, a 3,5-difluorophenyl group, a pentafluorophenyl group, an o-methoxyphenyl group, a m-methoxyphenyl group, a p-methoxyphenyl group, a p-ethoxyphenyl group, a p-propoxyphenyl group, a p-butoxyphenyl group, a p-pentyloxyphenyl group, a p-hexyloxyphenyl group, a 3,5-dimethoxyphenyl group, a 3,5-ethoxymethoxyphenyl group, a 3,5-ethoxyethoxyphenyl group, a 3,5-methoxyethoxyphenyl group and the like. Preferred are a phenyl group, a p-fluorophenyl group, a p-methoxyphenyl group, a p-hexyloxyphenyl group, and a 3,5-ethoxyethoxyphenyl group, and more preferred are a phenyl group and a p-methoxyphenyl group.

The "phenylalkoxy group optionally having substituent(s)" is an unsubstituted phenylalkoxy group or a phenylalkoxy group wherein a part of or all hydrogen atoms are substituted by a halogen atom (fluorine atom, chlorine atom, bromine atom, iodine atom etc.), a $C_1$-$C_6$ alkoxy group and the like. Examples thereof include a benzyloxy group, a phenylethoxy group, a p-fluorobenzyloxy group, a 3,5-difluorobenzyloxy group, a p-methoxybenzyloxy group, a 3,5-dimethoxybenzyloxy group and the like. Preferred are a benzyloxy group, a phenylethoxy group, a p-fluorobenzyloxy group, and a p-methoxybenzyloxy group, and more preferred are a benzyloxy group and a phenylethoxy group.

The "phenylalkylcarbamate group optionally having substituent(s)" is an unsubstituted phenylalkylcarbamate group or a phenylalkylcarbamate group wherein a part of or all hydrogen atoms are substituted by a halogen atom (fluorine atom, chlorine atom, bromine atom, iodine atom etc.), a $C_1$-$C_6$ alkoxy group and the like. Examples thereof include a benzylcarbamate group, a p-fluorobenzylcarbamate group, a 3,5-difluorobenzylcarbamate group, a p-methoxybenzylcarbamate group, a 3,5-dimethoxybenzylcarbamate group, a p-methoxybenzylcarbamate group, a 3,5-dimethoxybenzylcarbamate group, a phenylethylcarbamate group, and a phenylpropylcarbamate group, preferably a benzylcarbamate group.

A preferable embodiment of $R^2$ is the "$C_6$-$C_{16}$ unsubstituted alkyl group, or $C_1$-$C_6$ substituted alkyl group wherein a part of or all hydrogen atoms are substituted by a halogen atom or a $C_3$-$C_{12}$ alicyclic hydrocarbon group". A more preferable embodiment is the "$C_6$-$C_{16}$ unsubstituted alkyl group, or $C_1$-$C_6$ substituted alkyl group wherein a part of or all hydrogen atoms are substituted by a fluorine atom or an norbornyl group". Particularly preferable examples of $R^2$ include an n-hexyl group, an n-dodecyl group, a 2-norbornylmethyl group, and a 2,2,2-trifluoroethyl group.

Unit of the Formula (III).

The unit of the formula (III) includes an alanine unit, a phenylalanine unit and a lysine derivative unit.

$R^3$ in the formula is a methyl group, a benzyl group or a —($CH_2$)$_4$—NHX group, provided that X is a benzyloxycarbonyl group optionally substituted by a halogen atom or a $C_1$-$C_6$ alkoxy group, a $C_1$-$C_6$ alkylcarbonyl group optionally substituted by a halogen atom, an allyloxycarbonyl group, a fluorenylalkoxycarbonyl group, a benzenesulfonyl group optionally substituted by a $C_1$-$C_6$ alkyl group or a nitro group, or a $C_1$-$C_6$ alkyloxycarbonyl group.

In the lysine derivative unit, that is, a unit wherein $R^3$ is "—($CH_2$)$_4$—NHX group", the "$C_1$-$C_6$ alkoxy group" which is a substituent when X is "substituted benzyloxycarbonyl group" may be linear or branched chain, preferably a linear alkoxy group, and may contain an ether bond in the alkyl chain. Examples thereof include a methoxy group, an ethoxy group, an n-propoxy group, an n-butoxy group, an n-pentyloxy group, an n-hexyloxy group, an n-methoxyethoxy group, an n-ethoxyethoxy group, an n-methoxyethoxyethoxy group and an n-ethoxyethoxyethoxy group.

The "$C_1$-$C_6$ alkyl group" when X is a "$C_1$-$C_6$ alkylcarbonyl group", and the "$C_1$-$C_6$ alkyl group" which is a substituent when X is a "substitution benzenesulfonyl group" are linear or branched chain alkyl groups. Examples thereof include a methyl group, an ethyl group, an n-propyl group, an n-butyl group, an n-pentyl group, an n-hexyl group, an isopropyl group, a sec-butyl group, a tert-butyl group, a 2-methylbutyl group, a 3-ethylbutyl group and the like.

The lysine derivative unit is preferably an $N^\epsilon$-benzyloxycarbonyllysine unit wherein $R^3$ in the formula is —($CH_2$)$_4$—NH—CO—$CH_2$—$C_6H_5$.

Unit of the Formula (IV).

The unit of the formula (IV) is a glutamic acid γ-ester unit or an aspartic acid γ-ester unit.

$R^4$ in the formula is a $C_1$-$C_{12}$ alkoxy group, a $C_1$-$C_{12}$ alkyl group wherein a part of or all hydrogen atoms are substituted by a halogen atom, or a $C_1$-$C_{12}$ alkylcarbonyl group, and $R^4$ in the number of m may be the same or different.

The "$C_1$-$C_{12}$ alkoxy group" for $R^4$ is a linear or branched chain alkoxy group. Examples thereof include a methoxy group, an ethoxy group, an n-propoxy group, an n-butoxy group, an n-pentyloxy group, an n-hexyloxy group, an n-heptyloxy group, an n-octyloxy group, an n-nonyloxy group, an n-decyloxy group, an n-undecyloxy group, an n-dodecyloxy group, an isopropoxy group, a sec-butoxy group, a tert-butoxy group, a 2-ethylhexyloxy group, and a tert-octyloxy group. Of these, a $C_1$-$C_6$ alkoxy group (e.g., methoxy group, ethoxy group, n-propoxy group, n-butoxy group, n-pentyloxy group, n-hexyloxy group, isopropoxy group, sec-butoxy group, tert-butoxy group etc.) is preferable, and a methoxy group, an n-butoxy group, and an n-hexyloxy group are more preferable.

The "$C_1$-$C_{12}$ alkyl group wherein a part of or all hydrogen atoms are substituted by a halogen atom" is a linear or branched chain alkyl group. Examples of the halogen atom include a fluorine atom, a chlorine atom, a bromine atom, and an iodine atom, preferably a fluorine atom. Examples of such halogen-substituted alkyl group include a monofluoromethyl group, a difluoromethyl group, a trifluoromethyl group, a trifluoroethyl group, a trifluorodimethylethyl group, a hexafluoroisopropyl group, a pentafluoroethyl group, a trifluorobutyl group, a pentafluorobutyl group, a heptafluorobutyl group, a nonafluorobutyl group, a trifluoropentyl group, a trifluoroheptyl group, a trifluorooctyl group, a trifluorononyl group, a trifluorodecyl group, a trifluoroundecyl group, a trifluorododecyl group, a pentafluoropentyl group, a heptafluoropentyl group, an octafluoropentyl group, a nonafluoropentyl group, a dodecafluorohexyl group, a tridecafluorohexyl group, a heptadecafluorooctyl group, a henicosafluoroundecyl group, a heptadecafluoroundecyl group, a henicosafluorodecyl group, a henicosafluorododecyl group, a trichloromethyl group, a trichloroethyl group, a tribromomethyl group, a tribromoethyl group, a triiodomethyl group, and a triiodoethyl group. Of these, a trifluoromethyl group or a trifluoroethyl group is preferable, and a trifluoromethyl group is more preferable.

The "$C_1$-$C_{12}$ alkylcarbonyl group" is linear or branched chain. Examples thereof include methylcarbonyl, ethylcarbonyl, n-propylcarbonyl, isopropylcarbonyl, n-butylcarbonyl, isobutylcarbonyl, tert-butylcarbonyl, sec-butylcarbonyl, n-pentylcarbonyl, isopentylcarbonyl, neopentylcarbonyl, n-hexylcarbonyl, isohexylcarbonyl, 3-methylpentylcarbonyl, n-heptylcarbonyl, n-octylcarbonyl, n-nonylcarbonyl, n-decylcarbonyl, n-undecylcarbonyl, and n-dodecylcarbonyl. Of these, a $C_3$-$C_9$ alkylcarbonyl group is preferable, n-propylcarbonyl, isopropylcarbonyl, n-butylcarbonyl, isobutylcarbonyl, tert-butylcarbonyl, sec-butylcarbonyl, n-pentylcarbonyl, isopentylcarbonyl, neopentylcarbonyl, n-hexylcarbonyl, isohexylcarbonyl, n-heptylcarbonyl, and n-octylcarbonyl are more preferable, and n-hexylcarbonyl is particularly preferable.

Preferable embodiments of $R^4$ are a $C_1$-$C_6$ alkoxy group, a $C_1$-$C_{12}$ alkyl group wherein a part of or all hydrogen atoms are substituted by a fluorine atom, or a $C_3$-$C_9$ alkylcarbonyl group. Particularly preferable examples of $R^4$ include a methoxy group, an n-butoxy group, an n-hexyloxy group, a trifluoromethyl group, and an n-hexylcarbonyl group.

l is an integer of 6-12, preferably an integer of 6-10. In addition, m is an integer of 1-3, preferably 1 or 2. When m is 2 or 3, $R^4$ in the number of 2 or 3 may be the same or different, but preferably the same.

Unit of the Formula (V).

R$^5$ in the formula is a hydrogen atom, a methyl group, —CH(OH)CH$_3$, a C$_3$-C$_4$ branched chain alkyl group, or —(CH$_2$)$_n$—Z, wherein n is an integer of 1-4, Z is a hydroxy group, a mercapto group, a carboxy group, a methylsulfanyl group, an amino group, a substituted aryl group, an aminocarbonyl group, —NH—C(NH$_2$)═NH,

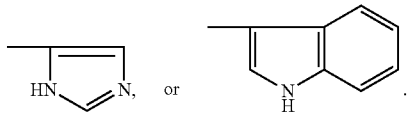

The "C$_3$-C$_4$ branched chain alkyl group" is preferably an isopropyl group or a sec-butyl group. n in the "—(CH$_2$)$_n$—Z group" is an integer of 1-4. Examples of the "substituted aryl group" for Z include a phenyl group, a naphthyl group and the like, wherein a part of or all hydrogen atoms are substituted by a halogen atom (fluorine atom, chlorine atom, bromine atom, iodine atom etc.) or a hydroxy group. Preferable examples thereof include a 4-hydroxyphenyl group and a phenyl group, particularly preferably a 4-hydroxyphenyl group.

A preferable embodiment of the unit of the formula (V) is a unit wherein R$^5$ is a hydrogen atom, a 4-aminobutyl group, a 4-hydroxybenzyl group, an aminocarbonylethyl group, or a —(CH$_2$)$_3$—NH—C(NH$_2$)═NH group.

The poly(α-amino acid) containing one or more kinds of units selected from the unit of formula (I)-unit of the formula (V) includes a homocopolymer of the unit of formula (I), a homopolymer of the unit of formula (II), a homopolymer of the unit of formula (III), a homopolymer of the unit of formula (IV), and a homopolymer of the unit of formula (V). When it is a copolymer, it includes a copolymer comprising two or more kinds of units from the units of formula (I), a copolymer comprising two or more kinds of units from the units of formula (II), a copolymer comprising two or more kinds of units from the units of formula (III), a copolymer comprising two or more kinds of units from the units of formula (IV), a copolymer comprising two or more kinds of units from the units of formula (V), and a copolymer comprising two or more different kinds of units from the unit of formula (I)-the unit of formula (V). The polymerization form of the copolymer may be a random copolymer or a block copolymer.

In the poly(α-amino acid), the α-amino acid constituting the units of formula (I)-formula (V) may be an L form or a D form, preferably an L form.

Specific examples of the homopolymer include poly(DL-alanine), poly(γ-methyl-L-glutamic acid), poly(γ-benzyl-L-glutamic acid), poly(L-arginine), poly(L-lysine), poly(L-tyrosine), poly(L-glycine) and the like.

Preferable examples of the embodiment of the copolymer include a copolymer comprising two or more kinds of units from the units of formula (I) (e.g., γ-methyl-L-glutamic acid/γ-benzyl-L-glutamic acid copolymer (preferably, γ-methyl-L-glutamic acid (5-95 mol %)/γ-benzyl-L-glutamic acid (5-95 mol %) copolymer)), and a copolymer comprising (A): one or more kinds of units from the units of formula (I), and (B): one or more kinds of units selected from the unit of formula (II), the unit of formula (III), and the unit of formula (IV). A particularly preferable embodiment is a copolymer comprising (A): one or more kinds of units from the units of formula (I), and (B): one or more kinds of units selected from the unit of formula (II), the unit of formula (III), and the unit of formula (IV).

As the copolymer comprising the unit (A) and the unit (B), a copolymer wherein the unit (A) is a glutamic acid γ-benzylester unit, wherein R$^1$ in formula (I) is a benzyl group, is particularly preferable since a poly(α-amino acid) having better piezoelectricity can be obtained. When the unit (B) is a copolymer comprising the unit of formula (II) or the unit of formula (IV), the copolymer is preferably a random copolymer. When the unit (B) is a copolymer comprising the unit of formula (III), the copolymer is preferably a block copolymer, particularly preferably an (A)-(B) type block copolymer or an (A)-(B)-(A) type block copolymer.

While the content of the unit (A) in the total units of the copolymer comprising the unit (A) and the unit (B) varies depending on the kind of the unit (B), it is preferably 0.01 mol % to 90 mol %. The upper limit is preferably 85 mol %, more preferably 80 mol %, and further preferably 60 mol %. The lower limit is preferably 0.1 mol %, more preferably 1 mol %, further preferably 5 mol %, still more preferably 10 mol %, more preferably 15 mol %, further preferably 20 mol %, and further more preferably 40 mol %.

While the content of the unit (B) varies depending on the kind of the unit (B), it is preferably 10 mol % to 99.99 mol %. The upper limit is preferably 99.9 mol %, more preferably 99 mol %, further preferably 95 mol %, further preferably 90 mol %, further preferably 85 mol %, further preferably 80 mol %, and further more preferably 60 mol %. The lower limit is more preferably 15 mol %, further preferably 20 mol %, and further more preferably 40 mol %. When the unit (B) is a unit of the formula (IV), the lower limit is preferably 50 mol %, more preferably 60 mol %, and further preferably 80 mol %.

When the copolymer comprising the unit (A) and the unit (B) is a copolymer comprising the unit of formula (I) and the unit of formula (II), for example, γ-methyl-L-glutamic acid (15 to 85 mol %)/γ-hexyl-L-glutamic acid (15 to 85 mol %) copolymer, γ-methyl-L-glutamic acid (40 to 60 mol %)/γ-dodecyl-L-glutamic acid (40 to 60 mol %) copolymer, γ-benzyl-L-glutamic acid (40 to 60 mol %)/γ-dodecyl-L-glutamic acid (40 to 60 mol %) copolymer, γ-methyl-L-glutamic acid (30 to 70 mol %)/γ-2,2,2-trifluoroethyl-L-glutamic acid (30 to 70 mol %) copolymer, γ-methyl-L-glutamic acid (40 to 60 mol %)/γ-2-norbornylmethyl-L-glutamic acid (40 to 60 mol %) copolymer, or γ-benzyl-L-glutamic acid (40 to 60 mol %)/γ-2-norbornylmethyl-L-glutamic acid (40 to 60 mol %) copolymer is preferable.

When it is a copolymer comprising the unit of formula (I) and the unit of formula (III), for example, γ-methyl-L-glutamic acid (20 to 80 mol %)/N$^ε$-benzyloxycarbonyl-L-lysine (20 to 80 mol %) copolymer, γ-benzyl-L-glutamic acid (40 to 60 mol %)/N$^ε$-benzyloxycarbonyl-L-lysine (40 to 60 mol %) copolymer, γ-methyl-L-glutamic acid (40 to 60 mol %)/L-phenylalanine (40 to 60 mol %) copolymer, γ-benzyl-L-glutamic acid (40 to 60 mol %)/L-phenylalanine (40 to 60 mol %) copolymer, or γ-benzyl-L-glutamic acid (40 to 60 mol %)/L-alanine (40 to 60 mol %) copolymer is preferable.

When it is a copolymer comprising the unit of formula (I) and the unit of formula (IV), for example, γ-methyl-L-glutamic acid (<1 mol %)/γ-(6-(p-methoxyphenoxy)-1-hexyl)-L-glutamic acid (>99 mol %) copolymer, γ-methyl-L-glutamic acid (<1 mol %)/γ-(6-(p-hexylcarbonylphenoxy)-1-hexyl)-L-glutamic acid (>99 mol %) copolymer, γ-methyl-L-glutamic acid (<1 mol to 16 mol %)/γ-(10-(p-methoxyphenoxy)-1-decyl)-L-glutamic acid (84 to >99 mol %) copolymer, γ-methyl-L-glutamic acid (<1 mol to 8 mol %)/γ-(6-(p-butoxy phenoxy)-1-hexyl)-L-glutamic acid (92 to >99 mol %) copolymer, γ-methyl-L-glutamic acid (<1 mol to 14 mol %)/γ-(6-(p-hexyloxyphenoxy)-1-hexyl)-L-glutamic acid (86 to >99 mol %) copolymer, γ-methyl-L-glutamic acid (<1 mol to 8 mol %)/γ-(6-(3,5-bis(trifluoromethyl)phenoxy)-1-hexyl)-L-glutamic acid (92 to >99 mol %) copolymer and the like are preferable.

While the molecular weight of the poly(α-amino acid) is not particularly limited, the weight average molecular weight (Mw) is preferably 1,000 to 5,000,000, more preferably 5,000 to 2,500,000, further preferably 10,000 to 2,000,000, from the aspects of piezoelectricity and film forming property of the poly(α-amino acid).

The preparation method of the poly(α-amino acid) is not particularly limited, and a production method known per se of poly(α-amino acid) can be adopted. In general, a method including appropriately mixing N-carboxy-α-amino acid anhydrides or N-carboxy-α-amino acid derivative anhydrides to be the unit of formula (I), the unit of formula (II), the unit of formula (III), the unit of formula (IV), or the unit of formula (IV), dissolving or suspending the mixture in an organic solvent or water, and copolymerizing same by adding a polymerization initiator as necessary can be mentioned. For example, when a copolymer comprising the units of the above-mentioned (A) and (B) is produced, a method including appropriately mixing N-carboxy-α-glutamic acid γ-methyl ester anhydride or N-carboxy-α-glutamic acid γ-benzylester anhydride to be the unit (A), and N-carboxy-α-amino acid anhydride or N-carboxy-α-amino acid ester derivative anhydride to be the unit (B), dissolving or suspending the mixture in an organic solvent or water, and copolymerizing same by adding a polymerization initiator as necessary can be mentioned. When a copolymer comprising the unit (B) which is the unit of formula (II) or the unit of formula (IV) is produced, a method including dissolving or suspending N-carboxy-α-glutamic anhydride or N-carboxy-α-glutamic acid γ-ester anhydride in an organic solvent or water, and copolymerizing same by adding a polymerization initiator as necessary to prepare poly α-glutamic acid or poly α-glutamic acid γ-ester, adding one or more kinds of particular alcohols to be the starting material in an appropriate amount relative to the glutamic acid unit of poly α-glutamic acid or poly α-glutamic acid γ-ester, adding a catalyst as necessary, and introducing an ester into the γ-position or converting ester at the γ-position can be mentioned.

Examples of the afore-mentioned organic solvent include acetone, methylethyl ketone, methyl isobutyl ketone, cyclohexanone, tetrahydrofuran, diethyl ether, diisopropyl ether, petroleum ether, 1,4-dioxane, benzene, toluene, xylene, hexane, cyclohexane, ethyl acetate, butyl acetate, trifluoroacetic acid, acetic acid, formic acid, dichloromethane, chloroform, carbon tetrachloride, 1,2-dichloroethane, trichloroethane, trichloroethylene, trifluoroethane, 1,1,1,3,3,3-hexafluoro-2-propanol, 2,2,2-trifluoroethanol, hexafluoroacetone, methanol, ethanol, 1-propanol, 2-propanol, formamide, N,N-dimethylformamide, N,N-dimethylacetamide, N-methylpyrrolidone, dimethyl sulfoxide, pyridine, acetonitrile, trimethylamine, triethylamine, and tributylamine. One or more kinds of the organic solvents can be used in combination.

Examples of the aforementioned polymerization initiator include primary diamines such as ethylenediamine, propylenediamine, hexamethylenediamine, 1,4-cyclohexanediamine, 1,2-cyclohexanediamine, o-phenylenediamine, m-phenylenediamine, p-phenylenediamine, toluene-2,4-diamine, 4,4'-diphenylmethanediamine, isophoronediamine and the like; primary monoamines such as methylamine, ethylamine, 1-propylamine and the like; alcoholamines such as methanolamine, ethanolamine, diethanolamine and the like; secondary amines such as dimethylamine, diethylamine, dipropylamine and the like; primary tertiary diamines such as N,N-dimethylethylenediamine, N,N-dimethyl-1,3-propanediamine and the like; tertiary amines such as trimethylamine, triethylamine, tributylamine and the like; amino group-containing polymers such as polyetherdiamine, polyester diamine and the like; primary alcohol such as methanol, ethanol and the like; secondary alcohols such as isopropanol and the like; glycols such as ethylene glycol, propylene glycol, 1,4-butanediol, hexamethylene glycol and the like; hydroxyl group-containing polymers such as polyetherdiol, polyester diol and the like; thiols and the like. One or more kinds of the polymerization initiators can be used in m combination.

Examples of the afore-mentioned catalyst include hydrochloric acid, sulfuric acid, nitric acid, p-toluenesulfonic acid, sodium hydroxide, potassium hydroxide, sodium methoxide, sodium t-butoxide, potassium methoxide, potassium t-butoxide, Potassium cyanide, carbon dioxide, titanium (IV)tetraisopropoxide, 1,3-substituted type tetraalkyldistannooxane tin(IV) complex, tetracyanoethylene, 4-dimethylaminopyridine, and diphenylammoniumtriflate-trimethylsilyl chloride. One or more kinds of the catalysts can be used in combination.

While the catalytic amount is appropriately determined according to the reaction, generally, it can be appropriately determined within the range that achieves an appropriate reaction time and does not make it difficult to remove the catalyst after the reaction. For example, it is 0.0001 to 1 equivalent, preferably 0.01 to 0.75 equivalent, more preferably 0.1 to 0.5 equivalent, relative to the number of moles of the amino acid anhydride to be used.

While the amount of the alcohol to be the starting material is appropriately determined according to the reaction, generally, it can be appropriately determined within the range that achieves sufficient conversion of the side chain and does not make it difficult to remove unreacted alcohol. It is, for example, 0.01 to 50 equivalents, preferably 0.1 to 25 equivalents, more preferably 0.15 to 20 equivalents, relative to the glutamic acid unit of poly(α-amino acid).

Figure 4A:
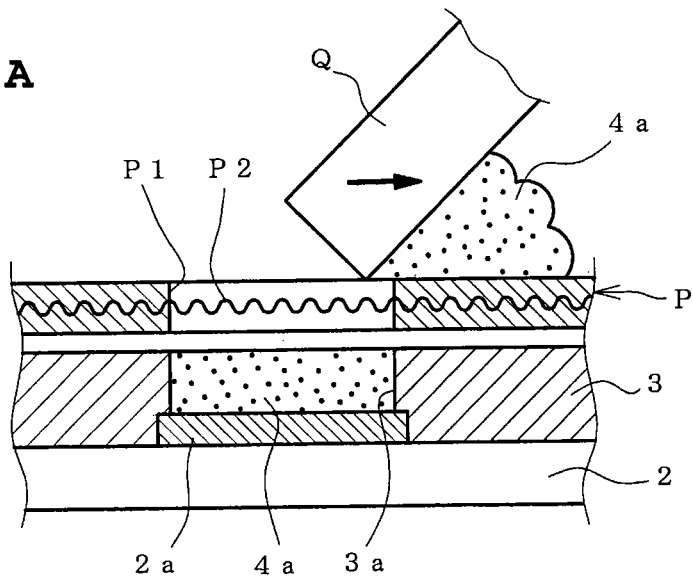
FIGS. 4A and 4B schematically show an organic material showing piezoelectricity which is filled or disposed by screen printing to leave an air gap in a space between the conductive parts. For easy understanding, the screen is separated from the spacer and drawn as if it is a thick plate.
Figure 4B:
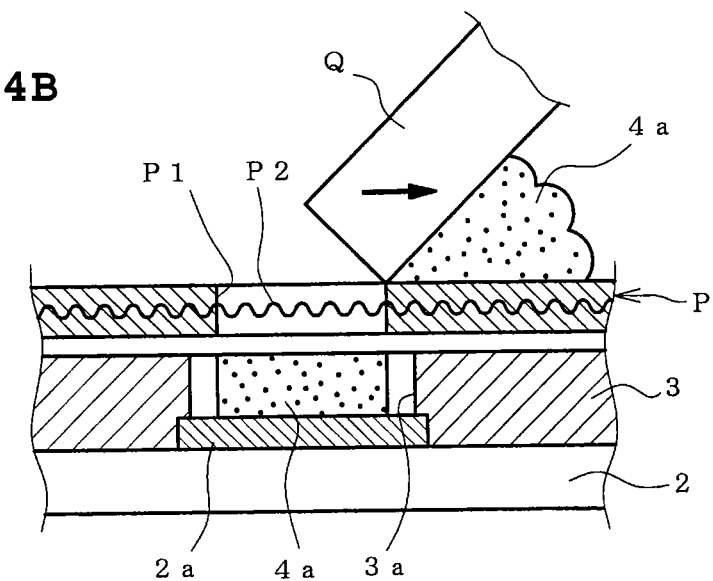

As a method of filling an organic material showing piezoelectricity or disposing same to leave an air gap in a space between conductive parts, as shown in FIGS. 4A and 4B, a method including forming a conductive part 2a and a wiring circuit (not shown) connected thereto on a substrate 2, laminating a spacer 3 having a through-hole 3a thereon, exposing an upper surface of the conductive part 2a in the bottom of the through-hole and, in this state, injecting ink (or paste) 4a containing an organic material showing piezoelectricity (the above-mentioned poly(α-amino acid) and the like) into the through-hole 3a by a printing method can be mentioned.

FIGS. 4A and 4B are schematic drawings showing examples of filling by screen printing, wherein a permeating opening P1 formed in screen P is positioned to match an opening of a through-hole 3a formed in a spacer 3, a squeegee Q moves in the arrow direction to scrape the screen, ink 4a on screen P passes through the permeating opening P1, and is pressed into the through-hole 3a right therebeneath. In the Figures, a wavy line P2 suggests the mesh of the screen, and is exposed in the opening P1.

In the embodiment of FIG. 4A, the shape of the permeating opening P1 formed in the screen P matches with the opening shape of the through-hole 3a formed in the spacer 3, and ink 4a is filled in the whole through-hole. When a substrate having a conductive part is laminated thereon, the membrane switch shown in FIG. 1A is obtained.

In the embodiment of FIG. 4B, the shape of the permeating opening P1 formed in the screen P is smaller than the opening shape of the through-hole 3a formed in the spacer 3, and ink 4a is filled only in a particular region in the upper surface of the conductive part 2a. When a substrate having a conductive part is laminated thereon, a membrane switch wherein an organic material showing piezoelectricity is filled only in a particular region (e.g., central region) between conductive parts is obtained as shown in FIG. 1C.

The printing method may be not only the above-mentioned screen printing but also gravure printing, offset printing, flexographic printing, inkjet printing or the like. In addition, techniques called soft lithography such as microcontact printing, micro-molding and the like are also included in the printing method.

The method of injecting an organic material showing piezoelectricity into a through-hole by printing is a preferable method in view of the cost, film thickness control and the like.

As a method other than printing for injecting a piezoelectric material into an air gap, a method including adhering a molded or cut organic piezoelectric material via an adhesive or an adhesion film, or thermocompression bonding, or injecting a molten material and the like can be mentioned.

When a poly($\alpha$-amino acid)-containing ink is used for the above-mentioned printing method, various organic solvents can be used for ink. Examples thereof include chlorohydrocarbon solvents such as chloroform, dichloromethane, methylene chloride, trichloroethylene, ethylene dichloride, 1,2-dichloroethane, tetrachloroethane, chlorobenzene and the like, fluorine-containing branched alcohol solvents such as perfluoro-tert-butanol, hexafluoro-2-methylisopropanol, 1,1,1,3,3,3-hexafluoroisopropanol and the like, nitrogen-containing polar solvents such as N-methylpyrrolidone, N,N-dimethylformamide, N,N-dimethylacetamide and the like, alkylketone solvents such as acetone, methyl ethyl ketone, diethylketone, acetophenone, cyclohexanone and the like, benzoic acid ester solvents such as methyl benzoate, benzoic acid ether, butyl benzoate and the like, aromatic hydrocarbon solvents such as benzene, toluene, xylene and solvent naphtha and the like, glycol ether solvents such as diethylene glycol monomethylether, triethylene glycol monomethylether, triethylene glycol dimethylether, propylene glycol monomethylether and the like, glycol ester solvents such as methylcellosolveacetate, methoxypropylacetate, Carbitol acetate, butylCarbitol acetate and the like, ether solvents such as dimethylether, diethyl ether, dipropylether, tetrahydrofuran, 1,4-dioxane, 1,3-dioxolane, methyl t-butylether and the like, sulfoxide sulfone-based solvents such as dimethyl sulfoxide, dimethylsulfone and the like, alcohol.phenol-based solvents such as methanol, ethanol, propanol, butanol, pentanol, ethylene glycol, propylene glycol, phenol, cresol, polyethylene glycol and the like, hydrocarbon solvents such as normal hexane, cyclohexane, normal heptane, isooctane, normal decane and the like, and the like.

One kind of organic solvent may be used singly or two or more kinds thereof may be used in a mixture.

One or more kinds selected from nitrogen-containing polar solvent, hydrocarbonketone solvent, benzoic acid ester solvent, aromatic hydrocarbon solvent, glycol ether solvent, and glycol ester solvent are preferable. Generally, a solvent having a boiling point of not less than 150° C. is preferably used for a printing method to avoid viscosity change caused by drying of ink during printing.

While the concentration of poly($\alpha$-amino acid) in the poly($\alpha$-amino acid)-containing ink is not particularly limited as long as uniform film forming can be achieved, it is preferably 1 to 50 wt %, more preferably 40 to 50 wt %, based on the total weight of the ink.

To achieve preferable piezoelectricity, the poly($\alpha$-amino acid)-containing ink preferably does not substantially contain a catalyst used for the synthesis of poly($\alpha$-amino acid) (e.g., the afore-mentioned catalysts such as p-toluenesulfonic acid and the like). The concentration of the residual catalyst is preferably not more than 6.0 wt %, more preferably not more than 1.0 wt %, further preferably not more than 0.5 wt %, particularly preferably not more than 0.1 wt %, based on the total weight of the ink.

As other method for filling an organic material showing piezoelectricity or disposing same to leave an air gap in the space between conductive parts, a method including forming a film made of an organic material showing piezoelectricity in a given outer shape with a given thickness, and adhering same to a conductive layer via an adhesive layer can be mentioned.

The membrane switch of the present invention can freely contain a member other than those mentioned above as long as the effect of the invention can be exhibited. For example, an embodiment wherein a film for a front side is further laminated on the outer surface of one of the substrates and a film for a back side is further laminated on the outer surface of the other substrate, and an embodiment wherein a shielding conductive layer to shut off noise from the outer world is imparted to an outer surface of either or both of the substrates can be mentioned, and an adhesive layer can be appropriately formed between respective layers.

In addition, a decorating layer may be formed to decorate the surface for the use thereof, a seal layer may be formed to improve durability, an adhesive layer may be further formed to utilize same for the assembly of various products using the membrane switch of the present invention, and the like.

The membrane switch of the present invention can be used in combination with various sensors. For example, when it is combined with a sensor of temperature, acceleration, radiation and the like, a plurality of information can be simultaneously sensed, and information of temperature and the like can also be used for normalization of the output of the switch of the present invention.

By applying the membrane switch of the present invention to various articles, namely, by placing the membrane switch along the surface layer of various articles (including placement showing on the surface, and placement not showing on the surface), an article imparted with a function to generate signals corresponding to the pressure applied from the outside can be obtained. Since the above-mentioned organic material is used as the material of a part showing piezoelectricity, a large area can be formed at a low cost as compared to the existing switches and sensors.

This can be a completely new form of an interface between humans and a computer, which is different from the existing keyboard, mouse, touch panel, microphone and the like, and application to a broad range of use is expected.

For example, when it is used on the surface of a robot, signals of each part can be obtained when something touches or in response to the level of touch. Therefore, it becomes an artificial skin capable of imparting a sense of touch to the robot. When it is used instead of the touch panels in smartphone, tablet terminal, or PC body, the membrane switch of the present invention can convey the strength of touch as signals to the computer, even though the existing touch panels can obtain only the coordinates of X and Y being touched as signals.

Also, when the membrane switch is placed along the surface layer of the part in receipt of load such as a bed, a mat, a chair (also including sofa, wheelchair, seat section of carriage (automobile, railway vehicle, aircraft and the like)) and the like, signals of each part corresponding to load distribution from the user can be obtained. Therefore, the distribution load in the surface can be visualized, the body pressure can be measured, and pressure ulcer can be prevented and the like. In addition, pulse, breathing and the like can be sensed and one's physical condition and the like can be shown in data, by analyzing the numerical number on the pressure sensor.

For the aforementioned use, it may be appropriately connected to, as an external device, a computer provided with display device, printer, input device and the like.

The following shows more specific application examples.

Various measuring apparatuses for measuring the intensity distribution of biological signals such as pulse (heartbeat), breathing, body motion and the like of living organisms are known wherein a plurality of sensor elements that detect minute vibrations are placed on the supporting surface of bed, mat, chair, sheet and the like. The membrane switch of the present invention may be used in place of one or more sensor elements to be placed on a bed and the like in such measuring apparatuses. The signals obtained from the membrane switch used in place of each sensor element undergo appropriate voltage conversion and digital conversion, and are treated as biological signals. It is also possible to appropriately set a filter for extracting biological signals in a given frequency band from the output of the membrane switch and a calculating part for calculating the intensity value of biological signals for each switch part, and form the intensity distribution by correlating the arrangement of each switch part contained in the membrane switch and the aforementioned intensity value.

The aforementioned bed and chair may be of a posture changeable type (configuration capable of changing the flat bed to a form having a back and the like by folding the bed) such as a sofa bed and a hospital bed. In this case, the biological signals can be extracted with higher precision, by weighing the biological signals obtained from each switch part, placed in plurality, in response to each posture. Thus, when the membrane switch of the present invention is used in place of a sensor element, various signal treatments may be added as appropriate.

Since vibration signals relating to heartbeat and pulse are small, detection of heartbeat may be sometimes difficult due to the vibration noise from the outside. To deal with such problem, a configuration wherein two or more of each switch part of the membrane switch of the present invention are placed on a bed and the like, and the biological vibration is detected by all switch parts is employed. In this case, vibration noise is also detected as a vibration element by each switch part. However, since the biological vibrations of breathing, heartbeat, and body motion occur at the same timing in all sensor elements, vibration noise from the outside can be effectively removed by calculation based on the timing of occurrence of breathing, heart beat, and body motion, which are common information from each sensor element.

As mentioned above, by using the present invention in place of a pressure sensor, an apparatus capable of preferably measuring the intensity distribution of biological signals distributed on a support surface such as bed, mat, sheet and the like can be obtained.

It is further possible to provide a sheet-like pressure measurement device by configuring an article by directly utilizing a sheet-like form of the membrane switch, such as a foot pressure measurement sheet (sheet for measuring which area on the back of a foot conveys how much load to the ground), a dental interlocking measurement device (sheet for measuring how much compressing load is acted on an object by which tooth, by biting the sheet in between the upper and lower teeth) and the like, In any configuration, the membrane switch is used to function as a sheet-like pressure-sensing head part, and changes in the electric current and changes in the electrostatic capacity between conductive parts are measured by an outside measuring apparatus.

Furthermore, the membrane switch of the present invention can be used as an alternative to a piezoelectric element in various sensors known to use a piezoelectric element, such as piezoelectric type acceleration sensor, gyro sensor and the like.

Furthermore, by placing (including placement showing on the surface, and placement not showing on the surface) the membrane switch of the present invention along the surface layer of various articles, articles utilizing voltage and the like occurring in response to a pressure applied from the outside, such as electric power generator, energy harvesting apparatus (apparatus to gather small energy into a power and the like) and the like can also be obtained.

Furthermore, by placing (including placement showing on the surface, and placement not showing on the surface) the membrane switch of the present invention along the surface layer of various articles, articles utilizing a driving force and the like occurring in response to an electric signal such as voltage and the like applied from the outside, such as actuator and the like, can also be obtained.

The membrane switch of the present invention is also expected to be suitable for use, such as energy harvesting and the like, that could not be considered as extension from the conventional membrane switches. When the electric charge generated by the membrane switch of the present invention is passed through a rectification circuit and stored in a capacitor and the like, the energy can be used. The stored electric energy can be used as an electric power source for driving various circuits connected to the membrane switch, and a self-power generation type sensor not requiring an outside power source and battery can be constituted. Also, it can also be used as an electric power source of various sensors to be used in combination with the membrane switch.

Other features of the invention will become apparent in the course of the following descriptions of exemplary embodiments which are given for illustration of the invention and are not intended to be limiting thereof.

EXAMPLES

Synthesis of poly($\alpha$-amino acid).

Synthetic Example 1. Synthesis of poly-$\gamma$-methyl-L-glutamic acid/$\gamma$-hexyl-L-glutamic acid copolymer Step 1. Synthesis of poly-$\gamma$-methyl-L-glutamic acid N-Carboxy-$\gamma$-methyl-L-glutamic anhydride (54.92 g, 293.45 mmol) was added to 1,2-dichloroethane (410 ml, manufactured by Kanto Chemical Co., Inc.), and the mixture was cooled to 0° C. N,N-Dimethyl-1,3-propanediamine (366 μl, 2.93 mmol, manufactured by Kanto Chemical Co., Inc.) was added as an initiator, and the mixture was stirred at 25° C. for 1 day to give poly-γ-methyl-L-glutamic acid. The weight average molecular weight Mw was measured by the following method (Measurement Method 1). The weight average molecular weight Mw was $1.9 \times 10^4$.

Step 2. Side Chain Substitution Reaction of poly-γ-methyl-L-glutamic acid (Transesterification Reaction)

Poly-γ-methyl-L-glutamic acid (9.3 g) prepared above was dissolved in 1,2-dichloroethane (45 ml), 1-hexanol (16 ml, 130.00 mmol, manufactured by Tokyo Chemical Industry Co., Ltd.) and p-toluenesulfonic acid monohydrate (1.24 g, 6.50 mmol, manufactured by Tokyo Chemical Industry Co., Ltd.) were added, and the mixture was stirred at 80° C. for 1 day to perform a transesterification reaction, whereby a γ-methyl-L-glutamic acid/γ-hexyl-L-glutamic acid copolymer was obtained. The weight average molecular weight Mw of the obtained copolymer was measured by the following method (Measurement Method 1). In addition, the composition of the polymer after transesterification reaction was measured by the following method (Measurement Method 2).

Synthetic Examples 2-3, 5-6 and 8-13. Syntheses of Various poly(α-amino acid)s By a method similar to that of Synthetic Example 1, poly-γ-methyl-L-glutamic acid was obtained, which was dissolved in 1,2-dichloroethane, and the alcohol shown in Table 1 (column of introduced alcohol) was added in an appropriate amount relative to the glutamic acid unit of poly-γ-methyl-L-glutamic acid. A catalytic amount of p-toluenesulfonic acid monohydrate was added and the mixture was stirred for 1 to 5 days. By these procedures, various kinds of poly(α-amino acid)s (copolymers) were obtained. The weight average molecular weight Mw of the obtained copolymers was measured by the following method (Measurement Method 1). In addition, the composition of the polymers after transesterification reaction was measured by the following method (Measurement Method 2).

Synthetic Example 4. Synthesis of γ-benzyl-L-glutamic acid/γ-dodecyl-L-glutamic acid copolymer

Step 1. Synthesis of poly-γ-benzyl-L-glutamic acid

N-Carboxy-γ-benzyl-L-glutamic anhydride (44.2 g, 167.98 mmol) and N,N-dimethyl-1,3-propanediamine (208.2 μl, 1.68 mmol) as an initiator were added to 1,2-dichloroethane (265 ml) (manufactured by Kanto Chemical Co., Inc.), and the mixture was stirred at 25° C. for 3 days to give poly-γ-benzyl-L-glutamic acid. The weight average molecular weight Mw was measured by the following method (Measurement Method 1). The weight average molecular weight Mw was $2.2 \times 10^4$.

Step 2. Side Chain Substitution Reaction of poly-γ-benzyl-L-glutamic acid (Transesterification Reaction)

Poly-γ-benzyl-L-glutamic acid (10 g, 45.6 mmol) prepared above was dissolved in 1,2-dichloroethane (170 ml), 1-dodecanol (10.2 mL, 45.6 mmol, manufactured by Tokyo Chemical Industry Co., Ltd.) and p-toluenesulfonic acid monohydrate (2.6 g, 13.68 mmol) were added, and the mixture was stirred at 65° C. for 1 day to give γ-benzyl-L-glutamic acid/γ-dodecyl-L-glutamic acid copolymer. The weight average molecular weight Mw of the obtained copolymer was measured by the following method (Measurement Method 1). In addition, the composition of the polymer after transesterification reaction was measured by the following method (Measurement Method 2).

Synthetic Example 7. Synthesis of γ-benzyl-L-glutamic acid/γ-2-norbornylmethyl-L-glutamic acid copolymer By a method similar to that of Synthetic Example 4, poly-γ-benzyl-L-glutamic acid was obtained, which was dissolved in 1,2-dichloroethane. Norbornane-2-methanol (manufactured by Tokyo Chemical Industry Co., Ltd.) in an equivalent amount and p-toluenesulfonic acid monohydrate in a catalytic amount were added relative to the glutamic acid unit of poly-γ-benzyl-L-glutamic acid, and the mixture was stirred at 65° C. for 4 days to give γ-benzyl-L-glutamic acid/γ-2-norbornylmethyl-L-glutamic acid copolymer. The weight average molecular weight Mw of the obtained copolymer was measured by the following method (Measurement Method 1). In addition, the composition of the polymer after transesterification reaction was measured by the following method (Measurement Method 2).

TABLE 1

| | polymer (composition: mol %) | introduced alcohol | Mw | substitution rate (mol %) |
|---|---|---|---|---|
| Synthetic Example 1 | γ-methyl-L-glutamic acid (48%)/γ-hexyl-L-glutamic acid (52%) copolymer | 1-hexanol | $1.5 \times 10^4$ | 52 |
| Synthetic Example 2 | γ-methyl-L-glutamic acid (18%)/γ-hexyl-L-glutamic acid (82%) copolymer | 1-hexanol | $3.2 \times 10^4$ | 82 |
| Synthetic Example 3 | γ-methyl-L-glutamic acid (50%)/γ-dodecyl-L-glutamic acid (50%) copolymer | 1-dodecanol | $2.9 \times 10^4$ | 50 |
| Synthetic Example 4 | γ-benzyl-L-glutamic acid (60%)/γ-dodecyl-L-glutamic acid (40%) copolymer | 1-dodecanol | $2.0 \times 10^4$ | 40 |
| Synthetic Example 5 | γ-methyl-L-glutamic acid (67%)/γ-2,2,2-trifluoroethyl-L-glutamic acid (33%) copolymer | 2,2,2-trifluoroethanol | $3.2 \times 10^4$ | 33 |

TABLE 1-continued

| | polymer (composition: mol %) | introduced alcohol | Mw | substitution rate (mol %) |
|---|---|---|---|---|
| Synthetic Example 6 | γ-methyl-L-glutamic acid (40%)/γ-2-norbornylmethyl-L-glutamic acid (60%) copolymer | norbornane-2-methanol | $2.6 \times 10^4$ | 60 |
| Synthetic Example 7 | γ-benzyl-L-glutamic acid (55%)/γ-2-norbornylmethyl-L-glutamic acid (45%) copolymer | norbornane-2-methanol | $2.2 \times 10^4$ | 45 |
| Synthetic Example 8 | γ-methyl-L-glutamic acid (<1%)/γ-(6-(p-methoxyphenoxy)-1-hexyl)-L-glutamic acid (>99%) polymer | 6-p-methoxyphenoxy-1-hexanol | $1.1 \times 10^5$ | — |
| Synthetic Example 9 | γ-methyl-L-glutamic acid (<1%)/γ-(6-(p-hexylcarbonylphenoxy)-1-hexyl)-L-glutamic acid (>99%) polymer | 6-p-hexylcarbonylphenoxy-1-hexanol | $9.6 \times 10^4$ | — |
| Synthetic Example 10 | γ-methyl-L-glutamic acid (16%)/γ-(10-(p-methoxyphenoxy)-1-decyl)-L-glutamic acid (84%) copolymer | 10-p-methoxyphenoxy-1-decanol | $1.2 \times 10^5$ | 84 |
| Synthetic Example 11 | γ-methyl-L-glutamic acid (8%)/γ-(6-(p-butoxy phenoxy)-1-hexyl)-L-glutamic acid (92%) copolymer | 6-p-butoxyphenoxy-1-hexanol | $1.7 \times 10^5$ | 92 |
| Synthetic Example 12 | γ-methyl-L-glutamic acid (14%)/γ-(6-(p-hexyloxyphenoxy)-1-hexyl)-L-glutamic acid (86%) copolymer | 6-p-hexyloxyphenoxy-1-hexanol | $1.9 \times 10^5$ | 86 |
| Synthetic Example 13 | γ-methyl-L-glutamic acid (8%)/γ-(6-(3,5-bis-(trifluoromethyl)phenoxy)-1-hexyl)-L-glutamic acid (92%) copolymer | (6-(3,5-bis(trifluoromethyl)phenoxy)-1-hexanol | $5.0 \times 10^4$ | 92 |

Synthetic Example 14. Synthesis of γ-methyl-L-glutamic acid/N$^\epsilon$-benzyloxycarbonyl-L-lysine copolymer Nα-Carboxy-N$^\epsilon$-benzyloxycarbonyl-L-lysine anhydride (4.02 g, 13.12 mmol) and N-carboxy-γ-methyl-L-glutamic anhydride (2.46 g, 13.12 mmol) were added to 1,2-dichloroethane (130 ml), N,N-dimethyl-1,3-propanediamine (32.78 μl, 0.262 mmol) was added as an initiator, and the mixture was stirred at 25° C. for 1 day to give γ-methyl-L-glutamic acid/N$^\epsilon$-benzyloxycarbonyl-L-lysine copolymer. The weight average molecular weight Mw of the copolymer was measured by the following method (Measurement Method 1). In addition, the composition of the copolymer was measured by the following method (Measurement Method 2).

Synthetic Examples 15-18. Syntheses of Various Copolymers

In the same manner as in Synthetic Example 14, equimolar amounts of two kinds of N-carboxy-L-amino acid anhydrides (component A, component B) shown in Table 2 were added to 1,2-dichloroethane, N,N-dimethyl-1,3-propanediamine as an initiator was added to amino acid anhydride at 1/100 equivalent, and the mixture was stirred for 2 to 3 days to give various poly(amino acid) copolymers. The weight average molecular weight Mw of the copolymers was measured by the following method (Measurement Method 1). In addition, the composition of the copolymers was measured by the following method (Measurement Method 2).

TABLE 2

| | | N-carboxy-L-amino acid anhydride | | |
|---|---|---|---|---|
| | polymer (composition: mol %) | Component A | Component B | Mw |
| Synthetic Example 14 | γ-methyl-L-glutamic acid (47%)/N$^\epsilon$-benzyloxycarbonyl-L-lysine (53%) copolymer | γ-methyl-L-glutamic acid | N$^\epsilon$-benzyloxycarbonyl-L-lysine | $5.5 \times 10^4$ |
| Synthetic Example 15 | γ-benzyl-L-glutamic acid (49%)/N$^\epsilon$-benzyloxycarbonyl-L-lysine (51%) copolymer | γ-benzyl-L-glutamic acid | N$^\epsilon$-benzyloxycarbonyl-L-lysine | $3.8 \times 10^4$ |
| Synthetic Example 16 | γ-methyl-L-glutamic acid (51%)/L-phenylalanine (49%) copolymer | γ-methyl-L-glutamic acid | L-phenylalanine | $4.0 \times 10^4$ |
| Synthetic Example 17 | γ-benzyl-L-glutamic acid (48%)/L-phenylalanine (52%) copolymer | γ-benzyl-L-glutamic acid | L-phenylalanine | $1.4 \times 10^5$ |
| Synthetic Example 18 | γ-benzyl-L-glutamic acid (50%)/L-alanine (50%) copolymer | γ-benzyl-L-glutamic acid | L-alanine | $1.5 \times 10^5$ |

Synthetic Example 19. Synthesis of γ-methyl-L-glutamic acid (68%)-N$^\varepsilon$-benzyloxycarbonyl-L-lysine block (32%) copolymer N-Carboxy-γ-methyl-L-glutamic anhydride (5.00 g, 26.72 mmol) was added to 1,2-dichloroethane (20 ml), and the mixture was cooled to 0° C. N,N-Dimethyl-1,3-propanediamine (66.80 μl, 0.534 mmol) was added as an initiator, and the mixture was stirred at 25° C. for 1 day and cooled again to 0° C., and 1,2-dichloroethane (20 ml) was added. Nα-Carboxy-N$^\varepsilon$-benzyloxycarbonyl-L-lysine anhydride (4.09 g, 13.36 mmol) was added, and the mixture was stirred at 25° C. for 1 day to give γ-methyl-L-glutamic acid-N$^\varepsilon$-benzyloxycarbonyl-L-lysine block copolymer. The weight average molecular weight Mw of the copolymer was measured by the following method (Measurement Method 1). In addition, the composition of the copolymer was measured by the following method (Measurement Method 2).

Synthetic Example 20. Synthesis of γ-methyl-L-glutamic acid (41%)-N$^\varepsilon$-benzyloxycarbonyl-L-lysine (18%) -γ-methyl-L-glutamic acid (41%) block copolymer In the same manner as in Synthetic Example 19, γ-methyl-L-glutamic acid-N$^\varepsilon$-benzyloxycarbonyl-L-lysine block copolymer was obtained, and cooled again to 0° C., and 1,2-dichloroethane (10 ml) was added. N-Carboxy-γ-methyl-L-glutamic anhydride (5.00 g, 26.72 mmol) was added, and the mixture was stirred at 25° C. for 2 days to give γ-methyl-L-glutamic acid —N$^\varepsilon$-benzyloxycarbonyl-L-lysine-γ-methyl-L-glutamic acid block copolymer. The weight average molecular weight Mw of the copolymer was measured by the following method (Measurement Method 1). In addition, the composition of the copolymer was measured by the following method (Measurement Method 2).

Synthetic Example 21. Synthesis of γ-benzyl-L-glutamic acid (50%)-N$^\varepsilon$-benzyloxycarbonyl-L-lysine (50%) block copolymer (Low Molecular Weight Form)

N-Carboxy-γ-benzyl-L-glutamic anhydride (1.00 g, 3.80 mmol) was added to 1,2-dichloroethane (10 ml), and the mixture was cooled to 0° C. N,N-Dimethyl-1,3-propanediamine (9.56 μl, 0.076 mmol) was added as an initiator, and the mixture was stirred at 25° C. for 1 day and cooled again to 0° C. Nα-Carboxy-N$^\varepsilon$-benzyloxycarbonyl-L-lysine anhydride (1.16 g, 3.80 mmol) was added, and the mixture was stirred at 25° C. for 1 day to give γ-benzyl-L-glutamic acid —N$^\varepsilon$-benzyloxycarbonyl-L-lysine block copolymer (low molecular weight form). The weight average m molecular weight Mw of the copolymer was measured by the following method (Measurement Method 1). In addition, the composition of the copolymer was measured by the following method (Measurement Method 2).

Synthetic Example 22. Synthesis of γ-benzyl-L-glutamic acid (53%)-N$^\varepsilon$-benzyloxycarbonyl-L-lysine (47%) block copolymer (Polymer)

N-Carboxy-γ-benzyl-L-glutamic anhydride (1.00 g, 3.80 mmol) was added to 1,2-dichloroethane (10 ml), and the mixture was cooled to 0° C. N,N-Dimethyl-1,3-propanediamine (0.48 μl, 3.8 μmol) was added as an initiator, and the mixture was stirred at 25° C. for 1 day and cooled again to 0° C. Nα-Carboxy-N$^\varepsilon$-benzyloxycarbonyl-L-lysine anhydride (1.16 g, 3.80 mmol) was added, and the mixture was stirred at 25° C. for 3 days to give γ-benzyl-L-glutamic acid-N$^\varepsilon$-benzyloxycarbonyl-L-lysine block copolymer (polymer form). The weight average molecular weight Mw of the copolymer was measured by the following method (Measurement Method 1). In addition, the composition of the copolymer was measured by the following method (Measurement Method 2).

TABLE 3

| | polymer (composition: mol %) | N-carboxy-L-amino acid anhydride component A | N-carboxy-L-amino acid anhydride component B | Mw |
|---|---|---|---|---|
| Synthetic Example 19 | γ-methyl-L-glutamic acid (68%)-N$^\varepsilon$-benzyloxycarbonyl-L-lysine (32%) block copolymer | γ-methyl-L-glutamic acid | N$^\varepsilon$-benzyloxycarbonyl-L-lysine | $1.7 \times 10^4$ |
| Synthetic Example 20 | γ-methyl-L-glutamic acid (41%)-N$^\varepsilon$-benzyloxycarbonyl-L-lysine (18%)-γ-methyl-L-glutamic acid (41%) block copolymer | γ-methyl-L-glutamic acid | N$^\varepsilon$-benzyloxycarbonyl-L-lysine | $4.8 \times 10^4$ |
| Synthetic Example 21 | γ-benzyl-L-glutamic acid (50%)-N$^\varepsilon$-benzyloxycarbonyl-L-lysine (50%) block copolymer | γ-benzyl-L-glutamic acid | N$^\varepsilon$-henzyloxycarbonyl-L-lysine | $3.5 \times 10^4$ |
| Synthetic Example 22 | γ-benzyl-L-glutamic acid (53%)-N$^\varepsilon$-benzyloxycarbonyl-L-lysine (47%) block copolymer | γ-benzyl-L-glutamic acid | N$^\varepsilon$-benzyloxycarbonyl-L-lysine | $1.4 \times 10^6$ |

Property Measurements of Poly(Amino Acid).

Measurement Method. Measurement Method of Weight Average Molecular Weight.

The weight average molecular weight Mw was measured using gel penetration chromatography (GPC). To be specific, an analysis column apparatus (manufactured by Showa Denko K.K., Shodex K-802 and K-806M) was mounted on an analysis apparatus for GPC (manufactured by Hitachi, Ltd., LaChrom Elite). A separately-prepared measurement solution was injected by 10 to 80 μl, and the measurement was performed under the conditions of eluent flow rate: 1 mL/min, column maintenance temperature: 40° C. The measurement solution was prepared by dissolving poly (amino acid) in chloroform to a concentration of 0.25 to 3.0% (w/v), and filtration through a filter. The weight average molecular weight Mw was calculated by comparing the retention time of the obtained peak and the retention time of the peak of the separately-measured polystyrene for calibration (manufactured by Showa Denko K.K., Shodex STANDARD SM-105).

Measurement Method 2. Measurement Method of Composition of Copolymer after Transesterification Reaction.

A sample (several dozen milligrams) was dissolved in deuterated chloroform or deuterated trifluoroacetic acid, and analyzed by $^1$H nuclear magnetic resonance spectrum ($^1$HNMR, Bruker Japan Co., Ltd., 400 MHz). The composition was calculated by comparing the peak area of proton at the α-position of amino acid before and after transesterification or in copolymerization. Measurement examples are shown below.

Composition Measurement of γ-methyl-L-glutamic acid/γ-hexyl-L-glutamic acid copolymer.

A synthesized copolymer (10 mg) was dissolved in deuterated trifluoroacetic acid, and the $^1$HNMR was measured. As a result, a peak derived from the methyl group of γ-methyl-L-glutamic acid was detected at around 3.8 ppm, and a peak derived from the proton at the α-position of γ-methyl-L-glutamic acid and γ-hexyl-L-glutamic acid was detected at around 4.7 ppm. When the peak area at around 3.8 ppm is A and the peak area at around 4.7 ppm is B, A/B was 1.17. In the case of poly-γ-methyl-L-glutamic acid, since A/B was 3.00, the amount of decrease is assumed to have been substituted by a hexyl group. Therefore, the content percentage of the hexyl group is 61% from 1.83/3.00=0.61. Hence, the composition of the copolymer is γ-methyl-L-glutamic acid (39%)/γ-hexyl-L-glutamic acid (61%).

Composition Measurement of γ-benzyl-L-glutamic acid/N$^ε$-benzyloxycarbonyl-L-lysine copolymer.

A synthesized copolymer (10 mg) was dissolved in deuterated trifluoroacetic acid, and the $^1$HNMR was measured. As a result, a peak derived from the benzyl group of N$^ε$-benzyloxycarbonyl-L-lysine and the benzyl group of γ-benzyl-L-glutamic acid was detected at around 5.1 ppm, a peak derived from the proton at the α-position of γ-benzyl-L-glutamic acid was detected at around 4.7 ppm, and a peak derived from the proton at the α-position of N$^ε$-benzyloxycarbonyl-L-lysine was detected at around 4.4 ppm. When the peak areas at around 5.1 ppm, 4.7 ppm and 4.4 ppm are A, B and C, respectively, A/B=4.00, A/C=4.00, and B/C=1.00. Since both B and C show an area of one proton, the composition of the copolymer is γ-benzyl-L-glutamic acid (50%)/N$^ε$-benzyloxycarbonyl-L-lysine (50%).

As shown in the above-mentioned two examples, the composition of polymer after transesterification reaction can be calculated by comparing the peak areas of methyl group and α-position when γ-methyl-L-glutamic acid is contained, and the peak areas of benzyl group and α-position when γ-benzyl-L-glutamic acid is contained.

Evaluation Method 3. Measurement of Piezoelectricity.

The piezoelectricity of the poly(α-amino acid)s of Synthetic Examples 1, 3, 4, 6, 7, 15, 19, 20, 21, and 22 was confirmed.

On a poly(ethylene terephthalate) (PET) substrate (thickness: 125±5 μm, length: 18 mm, width: 12 mm) having ITO (indium tin oxide) vapor-deposited thereon as an electrode was formed a polymer thin film as a piezoelectric film from a poly α-amino acid solution by a cast method using a suitable solvent. This thin film was placed between PET substrates with vapor-deposited ITO electrode to produce an element. A load (about 6 kg) was applied to the produced element and the electromotive force expressed thereby was measured at room temperature (20° C.) using a sauce meter manufactured by KEITHLEY.

TABLE 4

| | poly(α-amino acid) | | piezoelectricity maximum electromotive force on | film thickness (μm) |
|---|---|---|---|---|
| Example 1 | γ-methyl-L-glutamic acid (48%)/γ-hexyl-L-glutamic acid (52%) copolymer | Synthetic Example 1 | 15.0 | 48 |
| Example 2 | γ-methyl-L-glutamic acid (50%)/γ-dodecyl-L-glutamic acid (50%) copolymer | Synthetic Example 3 | 6.0 | 17 |
| Example 3 | γ-benzyl-L-glutamic acid (60%)/γ-dodecyl-L-glutamic acid (40%) copolymer | Synthetic Example 4 | 20.8 | 68 |
| Example 4 | γ-methyl-L-glutamic acid (40%)/γ-2-norbornylmethyl-L-glutamic acid (60%) copolymer | Synthetic Example 6 | 34.0 | 19 |
| Example 5 | γ-benzyl-L-glutamic acid (55%)γ-2-norbornylmethyl-L-glutamic acid (45%) copolymer | Synthetic Example 7 | 18.0 | 42 |
| Example 6 | γ-benzyl-L-glutamic acid (49%)-N$^ε$-benzyloxycarbonyl-L-lysine (51%) copolymer | Synthetic Example 15 | 49.0 | 50 |
| Example 7 | γ-methyl-L-glutamic acid (68%)-N$^ε$-benzyloxycarbonyl-L-lysine (32%) block copolymer | Synthetic Example 19 | 17.0 | 35 |
| Example 8 | γ-methyl-L-glutamic acid (41%)-N$^ε$-benzyloxycarbonyl-L-lysine (18%)-γ-methyl-L-glutamic acid (41%) block copolymer | Synthetic Example 20 | 7.0 | 26 |
| Example 9 | γ-benzyl-L-glutamic acid (50%)-N$^ε$-benzyloxycarbonyl-L-lysine (50%) block copolymer | Synthetic Example 21 | 30.6 | 59 |
| Example 10 | γ-benzyl-L-glutamic acid (53%)-N$^ε$-benzyloxycarbonyl-L-lysine (47%) block copolymer | Synthetic Example 22 | 33.9 | 19 |
| Example 11 | poly-γ-methyl-L-glutamic acid | | 7.0 | 51 |
| Example 12 | poly-γ-benzyl-L-glutamic acid | | 13.0 | 53 |

Poly-γ-methyl-L-glutamic acid (Mw: 3.3×104) and poly-γ-benzyl-L-glutamic acid (Mw: 3.8×104) are commercially available from Sigma-Aldrich Corporation.

Table 4 shows that the poly(amino acid) of the present invention has piezoelectricity.

Blending Example. Production of Poly(Amino Acid) Ink.

γ-Benzyl-L-glutamic acid (50%)-Nε-benzyloxycarbonyl-L-lysine (50%) block copolymer prepared in Synthetic Example 21 was added to excess ether to allow for reprecipitation, and the precipitate was dried in a vacuum pump overnight. The obtained γ-benzyl-L-glutamic acid (50%)-Nε-benzyloxycarbonyl-L-lysine (50%) block copolymer (solid, 36 parts by weight), silica particles (4 parts by weight), Carbitol acetate (30 parts by weight), and γ-butyllactone (30 parts by weight) were stirred for about 5 to 30 min by Awatori Rentaro ARE-310 (manufactured by THINKY CORPORATION) until the mixture became homogeneous. This was mixed in a three-roll mill to produce a poly(amino acid) ink.

The details of the components used is as follows.

silica particles: manufactured by NIPPON AEROSIL, trade name "RY-200", particle size specific surface area: 100 $m^2/g$ Carbitol acetate (EDGAc): manufactured by Kanto Chemical Co., Inc.

γ-butyllactone (GBL): manufactured by Junsei Chemical Co., Ltd.

Manufacture Example 1. Manufacture of Membrane Switch.

The membrane switch shown in FIG. 1A was produced based on the following production method.

Using a square (100 mm one side) polyimide film having a thickness of 50 μm ("Kapton (registered trade mark) 200H" manufactured by DU PONT-TORAY CO., LTD) as a substrate, one square (25 mm one side) conductive part on the center of the surface of the substrate, and a wiring circuit (width 500 μm) connected to the conductive part were formed using a conductive silver paste ("RA FS 059" manufactured by TOYOCHEM CO., LTD.). More particularly, the afore-mentioned conductive silver paste was deposited on the polyimide film by a screen printing method to draw a conductive part and a wiring circuit, which was dried at 150° C. for 5 minutes, and baked at 250° C. for 5 minutes to give a conductive layer. The measured value of the thickness of each of the conductive part and wiring circuit after baking was 8 μm for both.

Two sheets of the aforementioned substrate having the same configuration were produced for one sample to arrange them to face each other. In this Example, since the conductive part and the wiring circuit have simple shapes, the configuration of the two substrates is the same. The (conductive part and wiring circuit) on one substrate and the (conductive part and wiring circuit) on the other substrate are in a mirror image relationship such that both of them become identical when put together.

To one of the above-mentioned two sheets of substrates, 4 pieces of a polyimide tape with an adhesive layer ("Kapton tape" manufactured by DU PONT-TORAY CO., LTD., thickness 100 μm) were adhered in parallel with the four sides of the conductive part to cover the outer-peripheral marginal part of the conductive part by only 1 mm width throughout the whole circumference, whereby the periphery of the conductive part was surrounded, to give a spacer. This is a formation method for trial use assuming formation and adhesion of a spacer as another member, and imitates a case of punching out a through-hole with a press.

While the outer shape of the conductive part is a square (25 mm one side), the shape of the opening of the center through-hole formed by being surrounded with four pieces of polyimide tape is a square (23 mm one side).

The poly(amino acid) solution (solvent: 1,2-dichloroethane, solution concentration 12.8% (w/w), 200 μL) synthesized in the above-mentioned Synthetic Example 21 was directly added dropwise into the through-hole in the space of the above-mentioned substrate to fill the inside of the through-hole. The solution was dried at ambient temperature for 1 day to remove the solvent, whereby a layer of the organic material showing piezoelectricity was formed.

The other substrate produced first was placed, with the conductive part on the bottom side, on the substrate having a spacer and an organic material showing piezoelectricity, and the outer-peripheral edge of the substrate was fixed with a double-sided adhesive tape to give the membrane switch of the present invention.

For experiments, four samples having the same configuration were produced by the afore-mentioned production procedures.

In the cases of the poly(amino acid) solutions of Synthetic Examples 1, 3, 4, 6, 7, 15, 19, 20, and 22, the membrane switch of the present invention is obtained by filling each solution of Table 5 in a through-hole in the same manner as in Manufacture Example 1.

Manufacture Example 2. Manufacture of Membrane Switch.

Step Common to Upper Substrate (First Substrate) and Lower Substrate (Second Substrate).

A conductive part (25 mm one side) and a wiring pattern were formed by a subtractive method on polyimide with copper foil ("FELIOS film 25 μm—copper foil 9 μm" manufactured by Panasonic Corporation) by using a dry film resist ("ALPHO NIT4015" manufactured by Nichigo-Morton Co., Ltd.).

Using a dry film resist ("ALPHO NIT4015" manufactured by Nichigo-Morton Co., Ltd.), the polyimide with copper foil except the surface of a conductive part and the terminal portion of a wiring part (to finally be a connector part) was covered with the resist for plating. Ni-electroless plating (thickness 3 μm) was applied to the surface of the conductive part and the terminal portion of the wiring part, and Au-electroplating (thickness 0.03 μm) was further applied thereon to give a conductive part and a wiring part in a two-layer structure.

The dry film was detached, and solder resist ink for flexible substrate ("AE-70-M11" manufactured by Ajinomoto Fine-Techno Co., Inc.) was printed to produce a spacer (materials were disposed such that the final thickness after curing was 20 μm from the top surface of the polyimide substrate and 8 μm from the top surface of the Au layer).

Moreover, in the same manner as in the above-mentioned Manufacture Example 1, the outer shape of the conductive part was a square (25 mm one side), the opening shape of the center through-hole formed by being surrounded with resist ink was a square (23 mm one side). That is, the resist ink covers the outer-peripheral edge of the conductive part only by 1 mm in width throughout the whole circumference.

The resist ink was heated at 100° C. for 30 minutes to be in a semi-cured state by volatilizing the solvent.

Step Only for Lower Substrate (Second Substrate).

A poly(amino acid) ink produced in Formulation Example 1 in the opening formed with a semi-cured resist ink was formed by screen printing such that the last thickness after curing was 10 μm. By heating this at 150° C. for 30 minutes, the solvent of the poly(amino acid) ink was volatilized, and simultaneously, the resist ink was completely cured.

Adhesion of First and Second Substrates.

The first substrate obtained by the above (steps common to upper substrate (first substrate) and lower substrate (second substrate)), and the second substrate obtained by the above (step only for lower substrate (second substrate)) were adhered with a heated roll laminator.

Thereafter, ACF was placed between parts of both substrates, where respective wirings should be conducted via ACF. Then both substrates were adhered by using an iron to allow for conduction of the both wirings. This was heated at 150° C. for 30 minutes, whereby the semi-cured resist ink of the first substrate and ACF were completely cured.

TABLE 5

|  | solvent | polymer concentration wt % |
|---|---|---|
| Synthetic Example 1 | chloroform | 6.3 |
| Synthetic Example 3 | chloroform | 6.3 |
| Synthetic Example 4 | chloroform | 17.2 |
| Synthetic Example 6 | chloroform | 6.5 |
| Synthetic Example 7 | chloroform | 9.5 |
| Synthetic Example 15 | chloroform | 6.3 |
| Synthetic Example 19 | 1,2-dichloroethane | 12.9 |
| Synthetic Example 20 | 1,2-dichloroethane | 17.9 |
| Synthetic Example 21 | 1,2-dichloroethane | 12.8 |
| Synthetic Example 22 | 1,2-dichloroethane | 12.8 |

Evaluation Method 1. Evaluation of Signals Obtained by Adding Load to Membrane Switch.

Using a table-top type universal testing machine ("AGS-X series" manufactured by Shimadzu Corporation, load cell used 10N), a load was applied via a circular plate having a diameter of 20 mm to each of 4 samples of the membrane switch, obtained in the above-mentioned Manufacture Example 1, in the center of the conductive part, and the value of the electrostatic capacity between the conductive parts, which changes with an increasing load, was measured.

For the measurement of the electrostatic capacity, an LCR meter ("4284A precision LCR meter" manufactured by Agilent Technologies, Inc.) was used at a measurement frequency of 30 Hz, and the electrostatic capacity was measured at a plurality of points by changing the load between 0.5 to 7.5 N.

The inclination of the electrostatic capacity relative to the load applied to the membrane switch of (Manufacture Example 1) was calculated by the least-squares method to be 0.55 pF/N, and the correlation coefficient was calculated to be 0.98 on average. Therefrom it was found that a signal having a strong correlation with the force acted on the membrane switch can be obtained by taking out a change in the electrostatic capacity as an electric signal.

INDUSTRIAL APPLICABILITY

Different from conventional membrane switches, since the membrane switch of the present invention can obtain signals corresponding to the pressure, the switch of the present invention can confer a new function to keyboard, switch and the like.

In addition, since a pressure measurement substrate with a large area can be supplied at a very low cost, utilization thereof in a broad range of fields from consumer use to industrial use in the medical treatment, nursing care and health care is expected, unlike conventional membrane switches, for, for example, the measurement of the body pressure and foot pressure distribution, dental pressure sensor, human sensor in a seat of automobile, scanner for breathing and pulse, interface of game machine and smartphone, sensor for toy and the like.

Furthermore, a new use such as energy harvesting and the like, which is not present in the extension from the conventional membrane switches, is also expected.

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A membrane switch, comprising a first conductive part formed on a first substrate and a second conductive part formed on a second substrate, wherein the first substrate and the second substrate are layered via a spacer such that said first and second conductive parts face each other with a space therebetween,
wherein
an organic material showing piezoelectricity is filled in said space, or
an organic material showing piezoelectricity is disposed in said space such that an air gap is present between said organic material and one of said first and second conductive parts, and
wherein said spacer is in direct contact with each of the first substrate and the second substrate.

2. A membrane switch according to claim 1, comprising a plurality of said first conductive parts formed on said first substrate in a first arrangement pattern and a plurality of said second conductive parts formed on said second substrate in second arrangement pattern which corresponds to said first arrangement pattern,
wherein
said first substrate and said second substrate are layered via a spacer such that said plurality of said first conductive parts and said plurality of said second conductive parts face each other with a space therebetween and a plurality of pairs of conductive parts are arranged, and
an organic material showing piezoelectricity is filled or disposed to leave an air gap in the space between the conductive parts of each pair of the conductive parts.

3. A membrane switch according to claim 1, wherein the outer circumference of the space between said first and second conductive parts is surrounded by said spacer.

4. A membrane switch according to claim 1, wherein said spacer is formed by a punching process of a film having a thickness of said spacer and made of a material of said spacer.

5. A membrane switch according to claim 1, wherein said spacer is formed by coating one or both of a surface of said first substrate and a surface of said second substrate with an insulating material.

6. A membrane switch according to claim 5, wherein said spacer is the same material as one or both of said first substrate and said second substrate.

7. A membrane switch according to claim 1, wherein said organic material showing piezoelectricity is at least one member selected from the group consisting of:
 (a) an organic piezoelectric substance having piezoelectricity;
 (b) a composite material, comprising a base material composed of an organic piezoelectric substance having piezoelectricity and a filler made of another material having piezoelectricity and dispersed in the base material, which composite material as a whole being an organic material showing piezoelectricity different from the piezoelectricity of the base material; and
 (c) a composite material, comprising a base material composed of an organic material not having piezoelectricity and a filler made of a material having piezoelectricity and dispersed in the base material, which composite material as a whole being an organic material showing piezoelectricity.

8. A membrane switch according to claim 1, wherein said organic material showing piezoelectricity is poly(amino acid).

9. A membrane switch according to claim 8, wherein said poly(amino acid) is poly(α-amino acid) containing one or more kinds of units of an amino acid selected from the group consisting of glycine, alanine, valine, leucine, isoleucine, arginine, asparagine, aspartic acid, cystine, cysteine, glutamine, glutamic acid, histidine, lysine, ornithine, serine, threonine, tryptophan, methionine, phenylalanine, tyrosine and a derivative thereof.

10. A membrane switch according to claim 8, wherein said poly(amino acid) is poly(a-amino acid) containing one or more kinds of units selected from the group consisting of:
 a unit represented by formula (I),
 a unit represented by formula (II),
 a unit represented by formula (III),
 a unit represented by formula (IV), and
 a unit represented by formula (V):
formula (I):

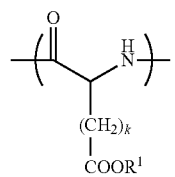

wherein k is an integer of 1 or 2, and $R^1$ is a $C_1$-$C_8$ substituted or unsubstituted alkyl group, or a benzyl group optionally substituted by a halogen atom, an alkoxy group or a nitro group;
formula (II):

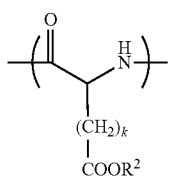

wherein k is an integer of 1 or 2, and $R^2$ is a $C_3$-$C_{16}$ unsubstituted alkyl group or a $C_1$-$C_6$ alkyl group wherein a part of or all hydrogen atoms are substituted by a halogen atom, a $C_3$-$C_{12}$ alicyclic hydrocarbon group, a $C_1$-$C_6$ alkoxy group, a cyano group, a phenyl group optionally having substituent(s), a phenylalkoxy group optionally having substituent(s) or a phenylalkylcarbamate group optionally having substituent(s), provided that $R^2$ is not the same group as $R^1$ in the formula (I),
formula (III):

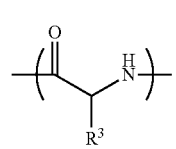

wherein $R^3$ is a methyl group, a benzyl group or a —$(CH_2)_4$—NHX group, provided that X is a halogen atom or a benzyloxycarbonyl group optionally substituted by a $C_1$-$C_6$ alkoxy group, a $C_1$-$C_6$ alkylcarbonyl group optionally substituted by a halogen atom, an allyloxycarbonyl group, a fluorenylalkoxycarbonyl group, a $C_1$-$C_6$ alkyl group or a benzenesulfonyl group optionally substituted by a nitro group, or a $C_1$-$C_6$ alkyloxycarbonyl group,
formula (IV):

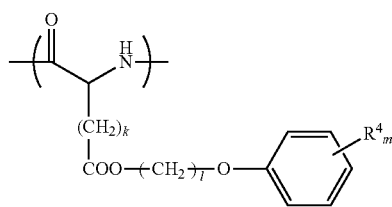

wherein k is an integer of 1 or 2, $R^4$ is a $C_1$-$C_{12}$ alkoxy group, a $C_1$-$C_{12}$ alkyl group wherein a part of or all hydrogen atoms are substituted by a halogen atom, or a $C_1$-$C_{12}$ alkylcarbonyl group, $R^4$ in the number of m may be the same or different, l is an integer of 6 to 12, and m is an integer of 1 to 3,
formula (V):

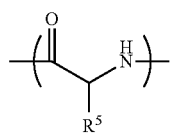

wherein $R^5$ is a hydrogen atom, a methyl group, —CH(OH)$CH_3$, a $C_3$-$C_4$ branched chain alkyl group, or —$(CH_2)_n$—Z, provided that n is an integer of 1-4, and Z is a hydroxy group, a mercapto group, a carboxy group, a methylsulfanyl group, an amino group, a substituted aryl group, an aminocarbonyl group, —NH—C($NH_2$)=NH,

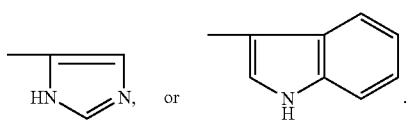

11. A membrane switch according to claim 10, wherein said poly(α-amino acid) is poly(α-amino acid) containing:
(A) one or more kinds of units represented by formula (I); and
(B) one or more kinds of units selected from a unit represented by formula (II), a unit represented by formula (III) and a unit represented by formula (IV).

12. A membrane switch according to claim 10, wherein $R^2$ is a $C_6$-$C_{16}$ unsubstituted alkyl group, or a $C_1$-$C_6$ substituted alkyl group wherein a part of or all hydrogen atoms are substituted by a fluorine atom or a norbornyl group.

13. A membrane switch according to claim 10, wherein $R^2$ is an n-hexyl group, an n-dodecyl group, a 2-norbornylmethyl group, or a 2,2,2-trifluoroethyl group.

14. A membrane switch according to claim 10, wherein $R^3$ is a methyl group or a —$(CH_2)_4$—NHX group wherein X is a benzyloxycarbonyl group.

15. A membrane switch according to claim 10, wherein $R^4$ is a $C_1$-$C_6$ an alkoxy group, a $C_1$-$C_{12}$ alkyl group wherein a part of or all hydrogen atoms are substituted by a fluorine atom, or a $C_3$-$C_9$ alkylcarbonyl group.

16. A membrane switch according to claim 10, wherein $R^4$ is a methoxy group, a butoxy group, a hexyloxy group, a trifluoromethyl group, or an n-hexylcarbonyl group.

17. A membrane switch according to claim 10, wherein $R^5$ is a hydrogen atom, a 4-aminobutyl group, a 4-hydroxybenzyl group, an aminocarbonylethyl group, or —$(CH_2)_3$—NH—$C(NH_2)$=NH.

18. A membrane switch according to claim 10, wherein said poly(amino acid) is poly(α-amino acid) containing one or more kinds of units of an amino acid selected from the group consisting of glutamic acid, aspartic acid, lysine, and a derivative thereof.

19. A membrane switch according to claim 10, wherein said poly(amino acid) is poly(α-amino acid) containing one or more kinds of units of an amino acid selected from the group consisting of glutamic acid methyl ester, glutamic acid benzylester, aspartic acid benzylester, and Nε-carbobenzoxy-L-lysine.

20. A membrane switch according to claim 10, wherein said poly(α-amino acid) is one or more members selected from the group consisting of
γ-methyl-L-glutamic acid/γ-hexyl-L-glutamic acid copolymer;
γ-methyl-L-glutamic acid/γ-dodecyl-L-glutamic acid copolymer;
γ-benzyl-L-glutamic acid/γ-dodecyl-L-glutamic acid copolymer;
γ-methyl-L-glutamic acid/γ-2,2,2-trifluoroethyl-L-glutamic acid copolymer;
γ-methyl-L-glutamic acid/γ-2-norbornylmethyl-L-glutamic acid copolymer;
γ-benzyl-L-glutamic acid/γ-2-norbornylmethyl-L-glutamic acid copolymer;
γ-methyl-L-glutamic acid/γ-(6-(p-methoxyphenoxy)-1-hexyl)-L-glutamic acid copolymer;
γ-methyl-L-glutamic acid/γ-(6-(p-hexylcarbonylphenoxy)-1-hexyl)-L-glutamic acid copolymer;
γ-methyl-L-glutamic acid/γ-(10-(p-methoxyphenoxy)-1-decyl)-L-glutamic acid copolymer;
γ-methyl-L-glutamic acid/γ-(6-(p-butoxy phenoxy)-1-hexyl)-L-glutamic acid copolymer;
γ-methyl-L-glutamic acid/γ-(6-(p-hexyloxyphenoxy)-1-hexyl)-L-glutamic acid copolymer;
γ-methyl-L-glutamic acid/γ-(6-(3,5-bis(trifluoromethyl)phenoxy)-1-hexyl)-L-glutamic acid copolymer;
γ-methyl-L-glutamic acid/Nε-benzyloxycarbonyl-L-lysine copolymer;
γ-benzyl-L-glutamic acid/Nε-benzyloxycarbonyl-L-lysine copolymer;
γ-methyl-L-glutamic acid/L-phenylalanine copolymer, γ-benzyl-L-glutamic acid/L-phenylalanine copolymer; and
γ-benzyl-L-glutamic acid/L-alanine copolymer.

21. A membrane switch according to claim 11, wherein said poly(α-amino acid) is a random copolymer.

22. A membrane switch according to claim 11, wherein said poly(α-amino acid) is a block copolymer.

23. A membrane switch according to claim 10, wherein said poly(α-amino acid) has a weight average molecular weight (Mw) of 1,000 to 5,000,000.

24. A membrane switch according to claim 1, wherein said organic material filled or disposed to leave an air gap in said space between the conductive parts is polarization-processed by applying a voltage between the conductive parts.

25. A membrane switch according to claim 1, wherein either one or both of said first substrate and said second substrate is a flexible substrate formed from a flexible material.

26. A membrane switch according to claim 1, wherein said first substrate, said second substrate, and said spacer are formed from a flexible material, and the whole membrane switch is flexible.

27. A membrane switch according to claim 1, wherein an adhesive layer is interposed: (a) between said first substrate and said spacer, and/or (b) between said second substrate and said spacer.

28. A membrane switch according to claim 1, wherein an adhesive layer is interposed between (i) said organic material filled or disposed to leave an air gap in said space between the conductive parts and (ii) said first and second conductive parts.

29. A membrane switch according to claim 1, further comprising a wiring circuit connected to said first and second conductive parts, wherein said first conductive part, said second conductive part, and said wiring circuit are formed by printing on the surfaces of said first and said second substrates.

30. An article, comprising a membrane switch according to claim 1, wherein said membrane switch is disposed along a surface layer of said article that receives a pressure, whereby said article is capable of generating a signal corresponding to said pressure.

* * * * *